(12) United States Patent
Joly et al.

(10) Patent No.: US 11,281,245 B1
(45) Date of Patent: Mar. 22, 2022

(54) BIAS CIRCUITS AND IMPROVED LINEARITY BIAS SCHEMES FOR RF POWER DEVICES

(71) Applicant: Wolfspeed, Inc., Durham, NC (US)

(72) Inventors: Christophe Joly, Sacramento, CA (US); Sonoko Aristud, Chandler, AZ (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 17/159,825

(22) Filed: Jan. 27, 2021

(51) Int. Cl.
| G05F 1/02 | (2006.01) |
| G05F 3/04 | (2006.01) |
| G05F 3/24 | (2006.01) |
| G05F 1/56 | (2006.01) |
| H03K 17/687 | (2006.01) |

(52) U.S. Cl.
CPC .............. G05F 1/56 (2013.01); H03K 17/687 (2013.01)

(58) Field of Classification Search
None
See application file for complete search history.

(56) References Cited

U.S. PATENT DOCUMENTS

| 6,300,837 B1* | 10/2001 | Sowlati ................. H03F 1/0261 330/296 |
| 6,414,553 B1* | 7/2002 | Luo ........................ H03F 1/302 330/288 |
| 7,332,968 B2* | 2/2008 | Luo ....................... H03F 1/0261 330/296 |
| 7,365,604 B2* | 4/2008 | Luo .......................... H03F 1/30 330/285 |
| 7,573,336 B2* | 8/2009 | Ishimaru ................. H03F 1/302 330/288 |
| 9,525,389 B2* | 12/2016 | Hirooka ................... H03F 3/19 |
| 10,469,032 B2* | 11/2019 | Namie .................. H03F 1/0211 |
| 2009/0256637 A1* | 10/2009 | Ishihara .................. H03F 1/302 330/289 |

* cited by examiner

*Primary Examiner* — Kenneth B Wells
(74) *Attorney, Agent, or Firm* — Myers Bigel, P.A.

(57) ABSTRACT

A radio frequency ("RF") power device includes a RF power transistor, and a bias circuit coupled between a reference voltage input and an input terminal of the RF power transistor. The bias circuit includes an impedance control circuit that is configured to vary an impedance of the bias circuit at the input terminal of the RF power transistor responsive to a RF input signal provided to the input terminal, and/or a current control circuit that is configured to control a bias current provided to the input terminal of the RF power transistor responsive to variations in operating characteristics of the RF power transistor. Related RF power amplifiers and device packages are also discussed.

43 Claims, 16 Drawing Sheets

BIAS CIRCUITS AND IMPROVED LINEARITY BIAS SCHEMES FOR RF POWER DEVICES

FIELD

The present invention relates to radio frequency ("RF") devices, and more particularly, to RF power transistor devices for RF amplifiers.

BACKGROUND

Communication devices may use power amplifiers to amplify an information signal prior to transmission. Power transistor devices including one or more RF power transistors (generally referred to herein as RF power devices) may provide excellent power performance and linearity, and are therefore often used in RF communication applications at high frequencies, for example, in the GHz range and microwave range, including 0.3-1 GHz (e.g., UHF), 1-2 GHz (e.g., L-Band), 1.7-2.6 GHz (e.g., R-band), 2-4 GHz (e.g., S-band) and 8-12 GHz (e.g., X-band).

RF power transistors may be implemented using semiconductor materials, most commonly Silicon (Si), Germanium (Ge), Silicon Germanium (SiGe), any III-V material such as Gallium-Arsenide (GaAs), Indium-Phosphide (InP) or Gallium Nitride (GaN). Additionally, RF power transistors are usually of the type of Field Effect or Bipolar. In some instances, RF power transistors may be implemented using wide bandgap semiconductor materials (e.g., having a band gap of greater than about 1.40 eV).

A typical RF power amplifier operates using a reference signal to bias the RF power transistors that make up the RF power amplifier. Transistor biasing is the process of setting a transistor's steady DC operating voltage or current conditions (also referred to as DC bias conditions or quiescent bias conditions) to the correct level so that a time-varying AC input signal can be amplified correctly by the transistor. The AC input signal is super-positioned on the DC bias current or voltage. Proper biasing of the transistors may be important to establish the proper quiescent current and to provide linearity in amplification of the AC input signal. Amplifier linearity may be of particular importance in modulation formats that encode information in the amplitude and/or phase variation of the AC signal, such as quadrature amplitude modulation (QAM). Linearity may thus be essential to preserving the integrity of the complex modulation formats used to achieve high data rates in communication applications that rely on accurate amplitude and/or phase control in transmission of an RF or other AC input signal, as non-linear operation can result in a loss of the transmitted data.

A bias circuit is used to control the operating point of an RF power transistor for variations in transistor characteristics and/or operating temperatures. The characteristics of an RF power transistor can also vary significantly due to changes in attributes caused by variations in device fabrication, referred to as process variations. Leakage current may also increase with temperature. A bias network may thus be configured to reduce effects of device variability, temperature, and voltage changes, to provide a bias current that is consistent across different parts and over temperature and process variations. For example, a bias circuit may need to provide a substantially constant current over a temperature range of about −40 degrees to +125 degrees Celsius (C).

Bias circuits may also need to maintain linearity over a range of modulation frequencies. In particular, as the bandwidth of cellular modulation increases from a few MHz to several hundreds of MHz, bias circuits of power amplifiers in the front end of RF transistor amplifiers may need to be able to handle linearity requirements in these ranges. Bias circuits for RF power amplifiers may thus fulfill several goals, including providing good linearity, low noise, etc., while providing a constant quiescent current to the device over a range of temperatures, frequencies, process variations, and/or other operating characteristics.

SUMMARY

According to some embodiments of the present invention, a radio frequency ("RF") power device includes an RF power transistor, and a bias circuit coupled between a reference voltage input and an input terminal of the RF power transistor. The bias circuit includes an impedance control circuit that is configured to vary an impedance of the bias circuit at the input terminal of the RF power transistor responsive to an RF input signal provided to the input terminal.

In some embodiments, the bias circuit may include a first transistor coupled between the reference voltage input and the input terminal of the RF power transistor, and the impedance control circuit may include at least one capacitor coupled to the first transistor.

In some embodiments, the at least one capacitor may be configured to bypass the first transistor responsive to a modulation frequency of the RF input signal.

In some embodiments, the first transistor may be a bipolar transistor. The at least one capacitor may be coupled between a collector terminal and an emitter terminal of the first transistor.

In some embodiments, the RF power transistor may be a bipolar transistor and the input terminal may be a base terminal thereof. The emitter terminal of the first transistor may be coupled to the base terminal of the RF power transistor.

In some embodiments, the RF power transistor may be a first RF power transistor that defines a first stage of an RF power amplifier. A second RF power transistor may define a second stage of the RF power amplifier. An input terminal of the second RF power transistor may be coupled to an output terminal of the first RF power transistor.

In some embodiments, the bias circuit may be a first bias circuit including a first impedance control circuit. A second bias circuit may be coupled between a reference voltage input and the input terminal of the second RF power transistor. The second bias circuit may include a second impedance control circuit that is configured to vary an impedance of the second bias circuit at the input terminal of the second RF power transistor responsive to the RF input signal provided to the input terminal of the first RF power transistor.

In some embodiments, the first and second RF power transistors may be bipolar transistors.

In some embodiments, the first RF power transistor may be a bipolar transistor, and the second RF power transistor may be a field effect transistor.

In some embodiments, the first RF power transistor may include gallium arsenide (GaAs), and the second RF power transistor may include gallium nitride (GaN) and/or silicon carbide (SiC).

In some embodiments, the impedance control circuit may be configured to reduce or stabilize a magnitude and/or phase of the impedance of the bias circuit responsive to changes in modulation frequency of the RF input signal.

According to some embodiments of the present invention, a radio frequency ("RF") power device includes an RF power transistor, and a bias circuit coupled between a reference voltage input and an input terminal of the RF power transistor. The bias circuit includes a current control circuit that is configured to control a bias current provided to the input terminal of the RF power transistor responsive to variations in operating characteristics of the RF power transistor.

In some embodiments, the bias circuit may include a first transistor coupled between the reference voltage input and the input terminal of the RF power transistor. The current control circuit may include a current mirror circuit coupled to the first transistor.

In some embodiments, the first transistor may be a bipolar transistor. The current mirror circuit may include first and second mirror transistors coupled to collector and base terminals of the first transistor, respectively.

In some embodiments, the RF power transistor may be a bipolar transistor and the input terminal may be a base terminal thereof. An emitter terminal of the first transistor may be coupled to the base terminal of the RF power transistor.

In some embodiments, the first and second mirror transistors may be bipolar transistors having respective base terminals coupled to the collector terminal of the first transistor.

In some embodiments, the operating characteristics of the RF power transistor may be a built-in voltage and/or current gain that vary based on an operating temperature and/or fabrication process thereof.

In some embodiments, the current mirror circuit may be configured to vary the bias current responsive to the variations in the operating characteristics to provide a substantially constant output current at an output terminal of the RF power transistor.

In some embodiments, the bias circuit may include an impedance control circuit that is configured to vary an impedance of the bias circuit at the input terminal of the RF power transistor responsive to an RF input signal provided to the input terminal.

According to some embodiments of the present invention, a radio frequency ("RF") power device includes an RF power transistor, and a bias circuit coupled between a reference voltage input and an input terminal of the RF power transistor. The bias circuit includes an impedance control circuit and a current control circuit. The impedance control circuit is configured to vary an impedance of the bias circuit at the input terminal of the RF power transistor responsive to an RF input signal provided to the input terminal. The current control circuit is configured to control a bias current provided to the input terminal of the RF power transistor responsive to variations in operating characteristics of the RF power transistor.

In some embodiments, the bias circuit may include a first transistor coupled between the reference voltage input and the input terminal of the RF power transistor. The impedance control circuit may include at least one capacitor coupled to the first transistor.

In some embodiments, the at least one capacitor may be configured to bypass the first transistor responsive to a modulation frequency of the RF input signal.

In some embodiments, the current control circuit may be a current mirror circuit coupled to the first transistor.

In some embodiments, the first transistor may be a bipolar transistor, and the at least one capacitor may be coupled between a collector terminal and an emitter terminal of the first transistor.

In some embodiments, the RF power transistor may be a bipolar transistor and the input terminal may be a base terminal thereof. The emitter terminal of the first transistor may be coupled to the base terminal of the RF power transistor.

In some embodiments, the current mirror circuit may include first and second mirror transistors coupled to the collector terminal and a base terminal of the first transistor, respectively.

In some embodiments, the first and second mirror transistors may be bipolar transistors having respective base terminals coupled to the collector terminal of the first transistor.

In some embodiments, the at least one capacitor may be configured to reduce (and/or reduce variations in) a magnitude and/or phase of the impedance of the bias circuit responsive to changes in modulation frequency of the RF input signal, and/or the current mirror circuit may be configured to vary the bias current responsive to the variations in the operating characteristics to provide a substantially constant output current at an output terminal of the RF power transistor.

According to some embodiments of the present invention, a radio frequency (RF) power device package includes a submount including RF input and output leads and at least one non-RF lead, an RF power transistor die on the submount, and a bias circuit coupled between the at least one non-RF lead and an input terminal of an RF power transistor of the RF power transistor die. The bias circuit includes an impedance control circuit and/or a current control circuit. The impedance control circuit is configured to vary an impedance of the bias circuit at the input terminal of the RF power transistor responsive to an RF input signal provided to the input terminal via the RF input lead. The current control circuit is configured to control a bias current provided to the input terminal of the RF power transistor responsive to variations in operating characteristics of the RF power transistor.

In some embodiments, the bias circuit may include a first transistor coupled between a reference voltage input and the input terminal of the RF power transistor. The impedance control circuit may include at least one capacitor coupled to the first transistor, and/or the current control circuit may include a current mirror circuit coupled to the first transistor.

In some embodiments, the at least one capacitor may be configured to bypass the first transistor responsive to a modulation frequency of the RF input signal.

In some embodiments, the first transistor may be a bipolar transistor. The at least one capacitor may be coupled between a collector terminal and an emitter terminal of the first transistor, and/or the current mirror circuit may include first and second mirror transistors coupled to the collector terminal and a base terminal of the first transistor, respectively.

In some embodiments, the RF power transistor may be a bipolar transistor and the input terminal may be a base terminal thereof, and the emitter terminal of the first transistor may be coupled to the base terminal of the RF power transistor.

In some embodiments, the RF power transistor may be a first RF power transistor that defines a first stage of an RF power amplifier. A second RF power transistor may be provided on the submount and may define a second stage of the RF power amplifier. An input terminal of the second RF power transistor may be coupled to an output terminal of the first RF power transistor.

In some embodiments, the bias circuit including the impedance control circuit and/or the current control circuit may be a first bias circuit including a first impedance control circuit and/or a first current control circuit. A second bias circuit may be coupled between a reference voltage input and the input terminal of the second RF power transistor. The second bias circuit may include a second impedance control circuit, and/or a second current control circuit. The second impedance control circuit may be configured to vary an impedance of the second bias circuit at the input terminal of the second RF power transistor responsive to the RF input signal provided to the input terminal of the first RF power transistor. The second current control circuit may be configured to control a bias current provided to the input terminal of the second RF power transistor responsive to variations in operating characteristics of the second RF power transistor.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Embodiments of the present invention are directed to bias circuits that are configured to control DC bias conditions of RF power transistor devices over a range of operating conditions, including operating temperatures, process variations, and RF input signal modulation frequencies, while simultaneously providing good linearity. That is, bias circuits as described herein may provide high power, high linearity, and good quiescent current control over temperature for RF power transistor devices.

Some RF power transistor or power amplifier devices (generally referred to as RF power devices) described herein may include one or more amplification stages, with each stage typically implemented as a transistor amplifier. In order to increase output power and current handling capabilities, RF power devices are typically implemented in a "unit cell" configuration in which a large number of individual "unit cell" transistor structures are fabricated on a common semiconductor die and may be arranged electrically in parallel. Each unit cell in the semiconductor material may define a respective transistor; for example, a bipolar transistor including a base region, a collector region, and an emitter region, or a field effect transistor including a source region, a drain region, and a channel region. In high power applications, such power semiconductor devices may include thousand or tens of thousands of unit cells implemented in a single chip or "die." A die or chip may include a small block of semiconducting material or other substrate in which electronic circuit elements are fabricated.

Figure 1A:
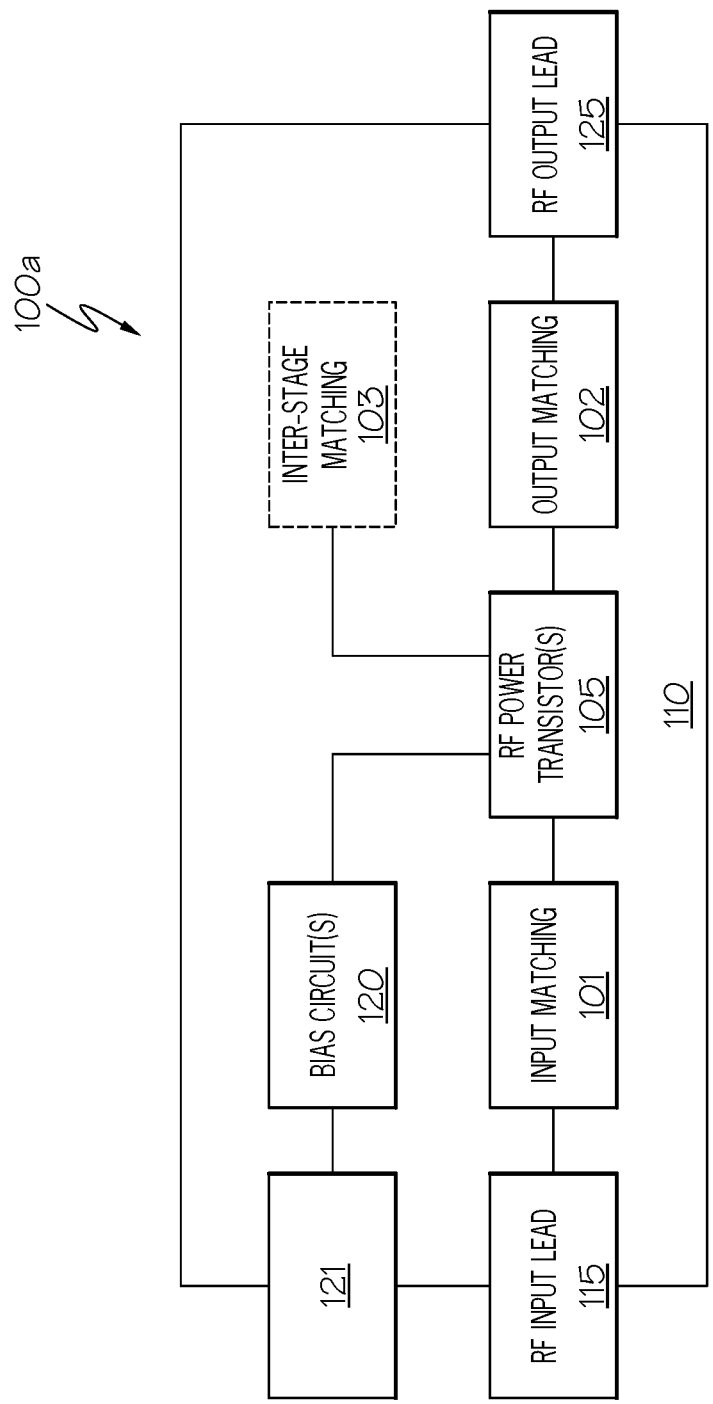
FIG. 1A is a schematic block diagram illustrating example components of an RF power device according to some embodiments of the present invention.
Figure 1B:
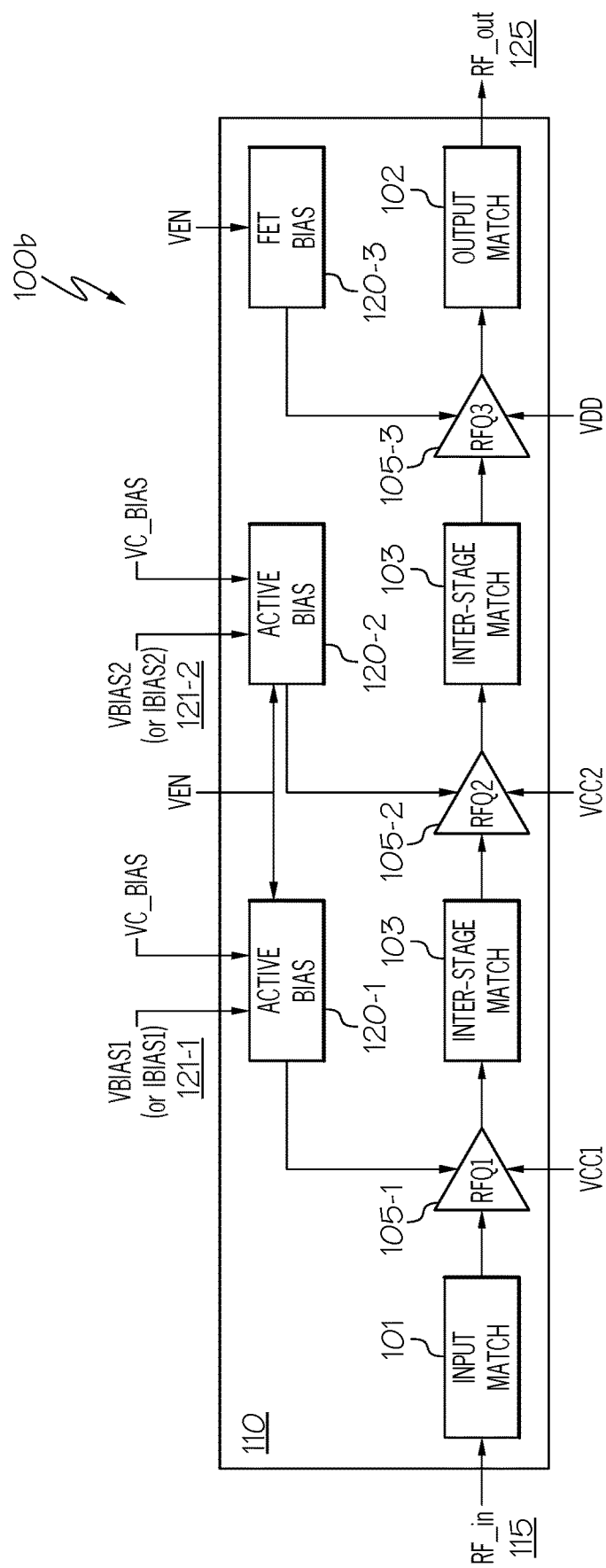
FIG. 1B is a schematic block diagram illustrating example components of an RF power device according to some embodiments of the present invention in greater detail.

FIG. 1A is a schematic block diagram illustrating an RF power device 100a according to some embodiments of the present invention. FIG. 1B is a schematic block diagram illustrating an RF power device 100b according to some embodiments of the present invention in greater detail.

As shown in FIGS. 1A and 1B, RF power devices 100a and 100b include one or more RF power transistors 105-1, 105-2, 105-3 (collectively 105) that are coupled between an electrically conductive RF input lead 115 and an RF output lead 125. Matching circuits, such as input, output, and inter-stage impedance matching circuits 101, 102, and 103, are configured to improve the impedance match between the active transistor dies 105 (e.g., including bipolar transistors, such as heterojunction bipolar transistors (HBTs), or field effect transistors, such as MOSFETs, HEMTs, LDMOS, etc.) and transmission lines connected thereto for the operating frequencies or frequency ranges of the modulated RF input signals. The input, output, and inter-stage impedance matching circuits 101, 102, and 103 may include inductor-capacitor (LC) networks that provide at least a portion of an impedance matching circuit that is configured to match the impedance of the active transistor die(s) 105 to a fixed value. Harmonic termination circuits, which may be configured to at least partly terminate harmonics (e.g., second- and/or third-order harmonics) that may be generated during RF power device operation, may also be included.

The RF power transistor(s) 105 as well as the impedance matching (and/or harmonic termination) circuits 101, 102, 103 may be provided on a package submount 110, which may include an electrically conductive attachment surface, and may be enclosed by a protective member in an integrated circuit device package. Integrated circuit packaging may refer to encapsulating one or more components in a supporting case or package for protection from physical damage and/or corrosion, and for supporting the electrical contacts or leads for connection to external circuits. The protective member may be implemented as an overmold (in which a plastic or other non-conductive encapsulant material is molded around the components) or an open cavity (in which a ceramic or other lid seals an open-air cavity around the components). The conductive RF leads 115 and 125 and non-RF lead(s) 121 (for example, a reference voltage or current input lead) may extend from the package, and are used to electrically connect the RF power transistor(s) 105 to external circuit elements such as input and output RF transmission lines and bias voltage sources.

Still referring to FIGS. 1A and 1B, the RF power devices 100a and 100b further include one or more bias circuits 120-1, 120-2, 120-3 (collectively 120) coupled between the reference voltage input(s) 121 and input terminal(s) of the RF power devices 105. The bias circuit(s) 120-1, 120-2, 120-3 are configured to set respective DC operating voltage or current conditions (i.e., DC bias conditions) for the respective RF power transistors 105-1, 105-2, and 105-3 so as to maintain respective output currents that are substantially constant, such that an AC input signal RF_in provided via RF input lead 115 can be amplified correctly by the RF power transistors 105 and output via RF output lead 125 as RF output signal RF_out.

In particular, FIG. 1B illustrates an RF power device implemented as a three-stage amplifier circuit 100b. The first two stages are implemented by RF transistors RFQ1 105-1 and RFQ2 105-2 (for example, bipolar transistors, such as HBTs), each including a respective active bias circuit 120-1 and 120-2 that is coupled between its input terminal and a respective reference signal input 121-1 and 121-2, such as a reference voltage (Vbias 1, Vbias2) or reference current (Ibias1, Ibias2). The third stage is implemented by an RF transistor RFQ3 105-3 (for example a FET), including an active bias circuit 120-3 coupled between its input terminal and a respective reference voltage (Ven). The reference voltage VEN may represent an enable signal that is also provided to the active bias circuits 120-1 and/or 120-2 in some embodiments. The respective reference voltages Vbias 1 and/or Vbias2 can also be connected to an additional supply voltage VC_bias in some embodiments.

In some embodiments, the RF power transistors 105-1, 105-2, 105-3 may be implemented using any range of semiconductor materials. For example, the RF power transistors 105-1 and 105-2, may be gallium arsenide (GaAs)-based bipolar transistors, while the RF power transistor 105-3 may be a gallium nitride (GaN)- and/or silicon carbide (SiC)-based field effect transistor. More generally, the implementation shown by the amplifier circuit 100b is by way of example only, and embodiments of the present invention may include alternative implementations and/or variations on those specifically illustrated herein. For example, in some embodiments, all three stages of the amplifier circuit 100b may be implemented by bipolar transistors. The bias circuits 120 may likewise include various implementations in accordance with embodiments of the present invention, depending for example on the modulation frequencies of the RF input signal RF_in and/or other operating conditions of the RF power transistors 105.

Figure 2A:
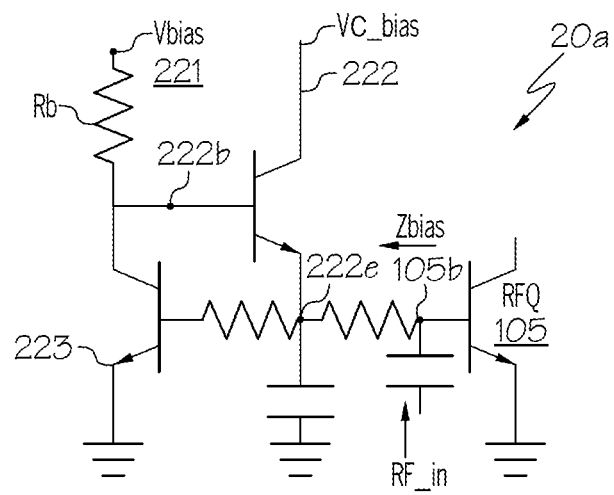
FIGS. 2A and 2B are schematic circuit diagrams illustrating examples of bias circuits for RF power devices.
Figure 2B:
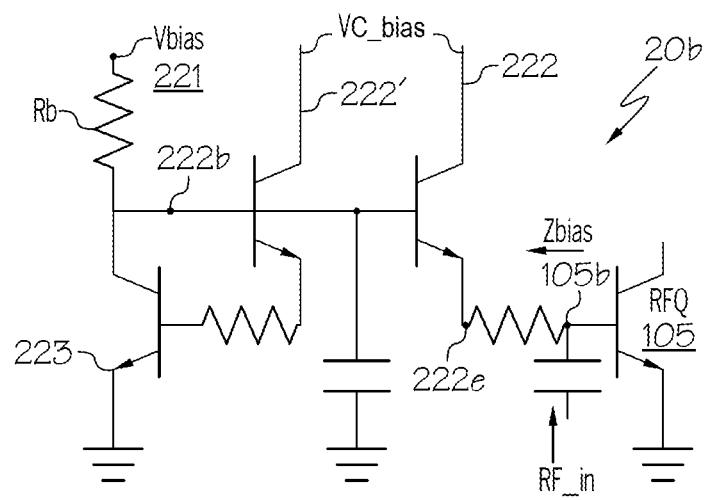

FIGS. 2A and 2B are schematic circuit diagrams illustrating examples of active bias circuits that may be used to bias RF power devices. As shown in FIGS. 2A and 2B, some bias circuits (illustrated as Type1 20a and Type2 20b) may include one or more transistors 222, 222' configured in an emitter-follower arrangement, also referred to herein as follower transistors. The follower transistors 222, 222' include a base terminal 222b that is coupled to a reference voltage input 221 (via bias resistor Rb) and a bias transistor 223, and an emitter terminal 222e that is coupled to the input terminal (shown as a base terminal 105b) of the RF power transistor RFQ (shown as a bipolar transistor 105). The Type2 bias circuit 20b may offer improved control over linearity distortion (e.g., as caused by undesired amplitude changes due to temperature and/or power supply variations) and noise as compared to the Type1 bias circuit 20a.

Some embodiments of the present invention may arise from realization that some bias circuits for RF power transistors may be unable to meet linearity requirements for RF power transistors at higher modulation frequencies of RF input signals. For example, the follower transistors 222, 222' of the bias circuits 20a, 20b may have limited frequency response, which may introduce sufficient operating lag so as to result in non-linear behavior of the RF power transistor RFQ 105 at higher modulation frequencies of the RF input signal RF_in (e.g., at modulation frequencies of greater than about 100 MHz). That is, at higher modulation frequencies of the RF input signal RF_in, the operation of the follower transistors 222 may render the bias circuits 20a, 20b incapable of properly biasing the RF power transistor RFQ 105 to provide the desired linearity.

Some embodiments of the present invention provide bias circuits including one or more sub-circuits that are configured to control or change the impedance (including magnitude and/or phase) presented by the bias circuit at the input terminal (e.g., base terminal or gate terminal) of an RF power transistor responsive to the frequency (or changes in frequency) of the RF input signal RF_in provided to the input terminal of the RF power transistor. The term Zbias may be used herein to refer to the impedance of a bias circuit (also referred to as bias circuit impedance) at the input terminal of an RF power transistor. In some embodiments, the power transistor may be a current controlled device, such as a bipolar transistor, and the input terminal may be the base terminal of the bipolar transistor. For example, the power transistor may be a gallium arsenide (GaAs)-based or Group III nitride-based device. The bipolar transistor may be a heterojunction bipolar transistor (HBT) in some embodiments.

Figure 3A:
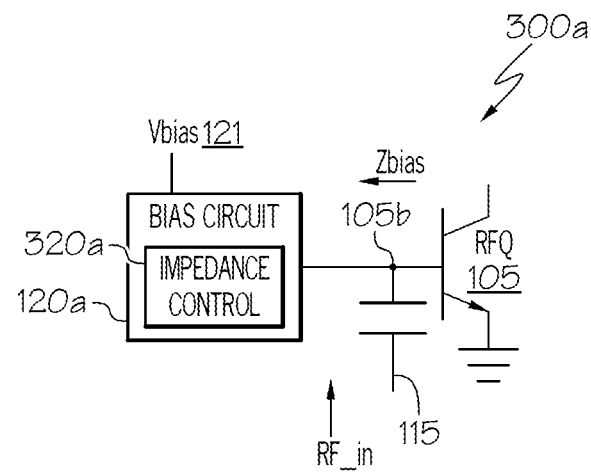
FIGS. 3A and 3B are schematic block and circuit diagrams illustrating examples of bias circuits for RF power devices according to some embodiments of the present invention.
Figure 3B:
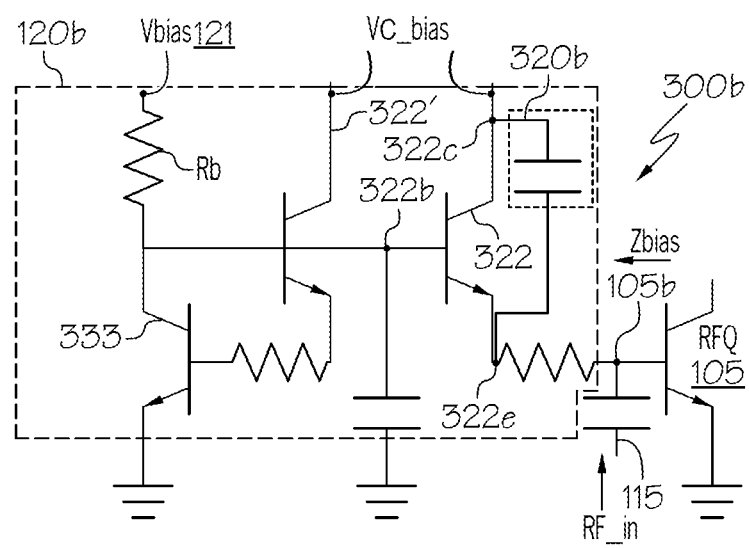

FIGS. 3A and 3B are schematic block and circuit diagrams illustrating examples of bias circuits for RF power devices 300a and 300b in accordance with some embodiments of the present invention. As shown in FIGS. 3A and 3B, a bias circuit 120a, 120b (collectively 120) is coupled between a reference signal input (illustrated by way of example as a reference voltage input Vbias 121) and an input terminal (illustrated by way of example as a base terminal 105b) of an RF power transistor RFQ (illustrated by way of example as a bipolar transistor 105). For example, the RF power transistor 105 may be an HBT, but embodiments of the present invention are not limited to any particular implementation of the RF power transistor 105.

The bias circuit 120 includes an impedance control circuit 320a, 320b (collectively 320) that is configured to change or vary an impedance Zbias of the bias circuit 120 at the input terminal 105*b* of the RF power transistor 105 responsive to an RF input signal RF_in provided to the input terminal 105*b* via RF input lead 115. More particularly, the impedance control circuit 320 is configured to reduce (or reduce variation in) the impedance Zbias presented or seen at the base 105*b* of the RF power transistor 105 responsive to changes in the modulation frequency of the RF input signal RF_in.

FIG. 3B illustrates an example implementation of an impedance control circuit 320*b* that braces or is otherwise coupled to a follower transistor 322 of the bias circuit 120 to improve frequency response. The follower transistor 322 may be a bipolar device including a base terminal 322*b* coupled to the reference voltage input 121, and an emitter terminal 322*e* coupled to the base terminal 105*b* of the RF power transistor 105. One or more additional follower transistors 322' may be included in some embodiments. While illustrated as bipolar transistors by way of example, it will be understood that other transistor types (e.g., FETs) may be used to implement one or more of the illustrated transistors. For example, the follower transistor(s) 322, 322' may be FETs in some embodiments. Likewise, the transistors 105 and 333 are not limited to bipolar devices. However, some embodiments described herein may utilize the same transistor type for the transistors 105 and 333.

Because the follower transistor(s) 322, 322' may have a limited frequency response, the impedance control circuit 320*b* may allow the bias circuit 120 to more quickly respond to changes (e.g., in frequency, phase, and/or amplitude (including maxima/peaks and minima/valleys)) in the RF input signal RF_in. In particular, as shown in FIG. 3B, the impedance control circuit is implemented by at least one capacitor 320*b* that is configured to bypass the follower transistor 322 responsive to a frequency of the RF input signal RF_in. The capacitor 320*b* is coupled between the collector 322*c* and emitter 322*e* terminals of the follower transistor 322, such that the capacitor 320*b* may effectively change bias circuit impedance at higher frequencies of the RF input signal RF_in. Bypassing the follower transistor 322 with the capacitor 320*b* functions to change the behavior of the bias circuit 120. When a modulated signal is sent through the RF power device 300*b*, nonlinear components may be generated by a combination of the RF transistor 105 and the bias circuit 120*b*. The capacitor 320*b* functions to change the bias circuit source impedance Zbias across changes in the frequency spectrum, thereby reducing intermodulation distortion for low frequency modulation (e.g., less than about 10 MHz, for example, about 5 MHz or less) as well as for high frequency modulation (e.g., greater than about 100 MHz, for example, about 200 MHz or more) of the RF input signal RF_in.

That is, the bypass capacitor 320 may aid in lowering and reducing changes, with respect to frequency, in impedance Zbias at the base terminal 105*b* of the RF power transistor 105 by bypassing the follower transistor 322, where the RF input signal RF_in provided to the RF input lead 115 may have unimpeded peaks and valleys, especially at high frequencies. The capacitor 320*b* may thus improve the frequency response of the bias circuit 120 at higher modulation frequencies. Accordingly, and in contrast to some existing bias circuits, linearity may be extended to high bandwidth signals with impedance control circuits 320 as described herein.

In some embodiments, the bypass capacitor 320*b* may be implemented as a surface mount device (SMD) component, which may be coupled to a separate die that includes the components of the bias circuit 120, e.g., by conductive interconnections such as a wire bonds. Providing the bypass capacitor 320*b* and/or other elements as discrete or separate components (i.e., off-chip from the die that includes one or more components of the bias circuit 120) may allow for implementation flexibility, for example, for larger capacitor values. In other embodiments, the bypass capacitor 320*b* may be integrated on-chip or in a same die as one or more other components of the bias circuit 120.

FIGS. 4A-4D are graphs illustrating changes in impedance (including resistance, reactance, magnitude, and phase) vs. frequency in RF power devices including conventional bias circuits as compared to bias circuits according to some embodiments of the present invention. As shown in FIGS. 4A-4D, the impedance control circuit 320 may function to allow the bias circuit 120 to supply current to the RF power transistor 105 while significantly reducing the impedance Zbias and/or reducing changes in the impedance Zbias over frequency seen at the base terminal 105*b* of the RF power transistor 105 over a range of modulation frequencies of the RF input signal RF_in.

Figure 4A:
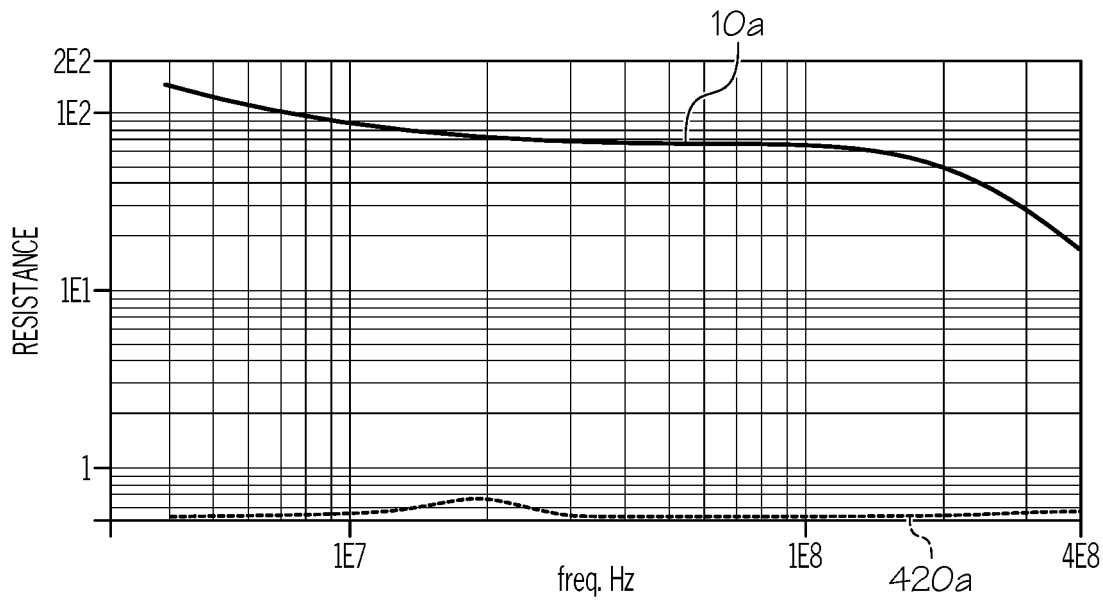
FIGS. 4A, 4B, 4C, and 4D are graphs illustrating changes in impedance vs. frequency in RF power devices including conventional bias circuits and bias circuits according to some embodiments of the present invention.
Figure 4B:
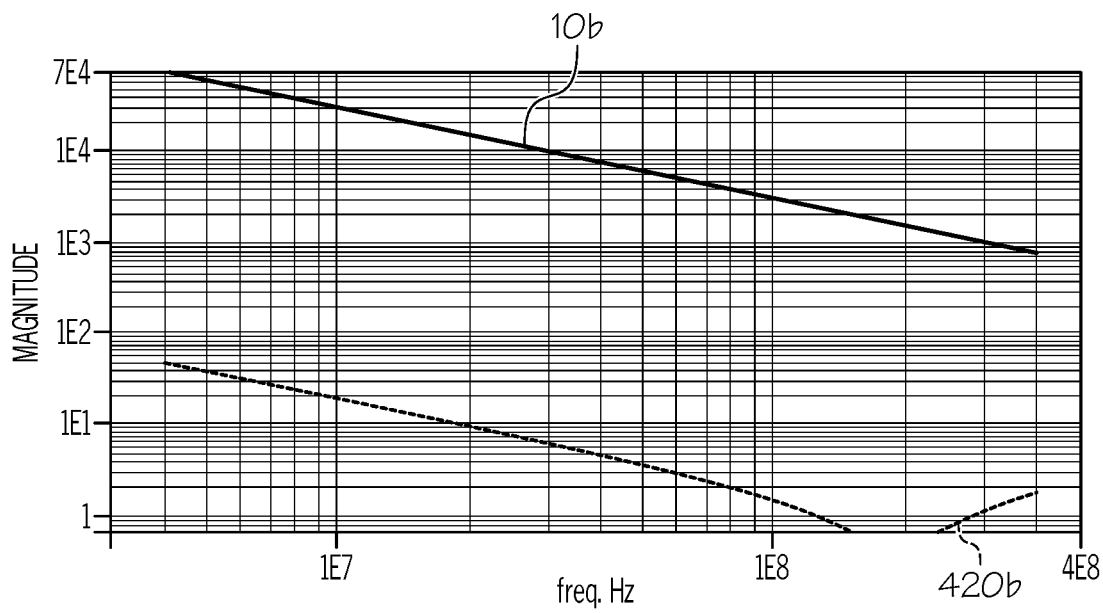
Figure 4C:
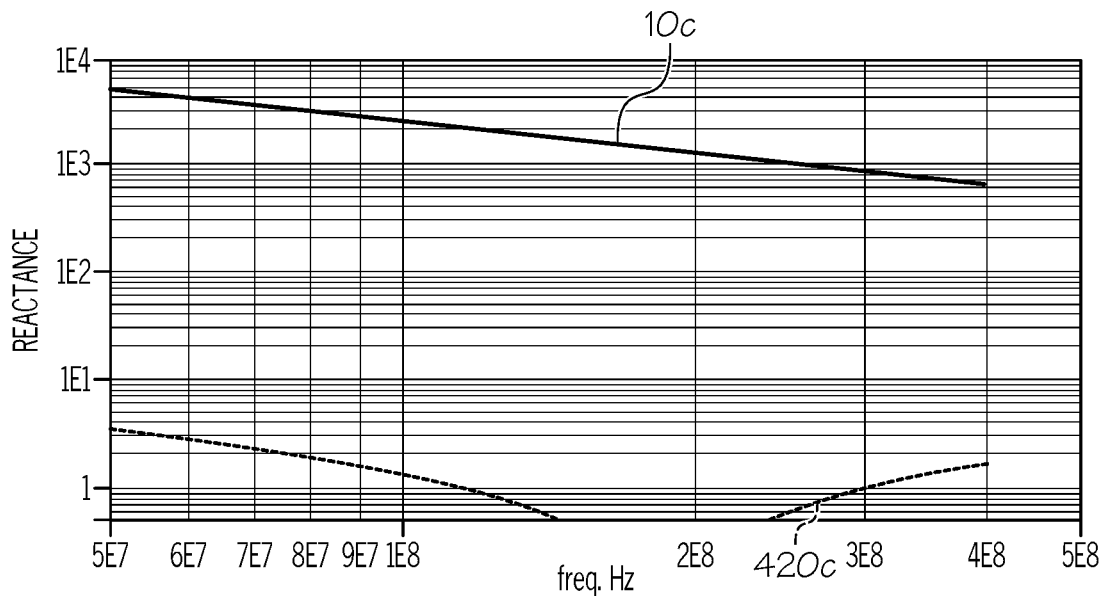
Figure 4D:
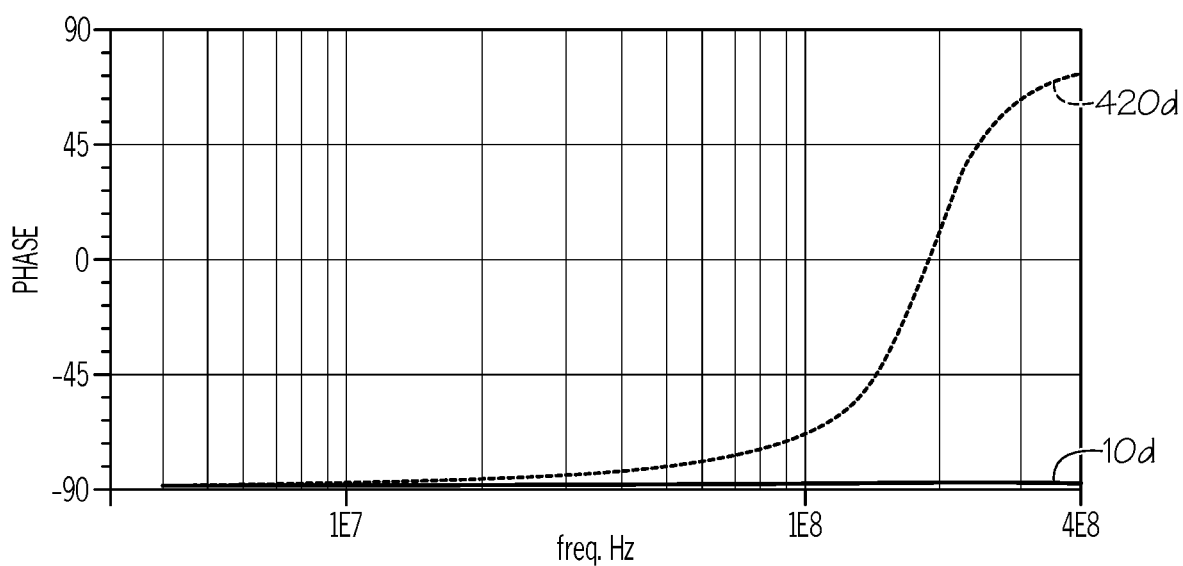

In particular, FIGS. 4A, 4B, and 4C illustrate that changes in the real component 420*a* (i.e., the resistance), the magnitude 420*b*, and the imaginary component 420*c* (i.e., the reactance) of the bias circuit impedance Zbias are reduced or smoothed over the modulation frequency of the RF input signal RF_in for bias circuits 120 including impedance control circuits 320 as described herein as compared to the real component 10*a*, the magnitude 10*b*, and the imaginary component 10*c* of the bias circuit impedance Zbias for some conventional bias circuits 20. For example, FIG. 4A illustrates that the resistance 420*a* of a bias circuit 120 including an impedance control circuit 320 as described herein is minimized or substantially maintained at significantly lower values in comparison to the resistance 10*a* of some conventional bias circuits over RF input signal frequencies in the MHz to GHz range. FIG. 4C illustrates that the reactance 420*c* of a bias circuit 120 including an impedance control circuit 320 as described herein is also substantially lower than (and varies substantially less than) the reactance 10*c* of some conventional bias circuits, as likewise shown by the corresponding impedance magnitude values 420*b* and 10*b* in FIG. 4B. That is, the resistance 10*a*, the impedance magnitude 10*b*, and the reactance 10*c* of some conventional bias circuits 20 may be greater than and may vary over a wider range of values than the resistance 420*a*, the impedance magnitude 420*b*, and the reactance 420*c* of bias circuits 120 including impedance control circuits 320 as described herein, over changes in frequency of the RF input signal RF_in.

That is, absent impedance control circuits 320 in accordance with embodiments of the present invention, the input terminal of the RF power transistor 105 may be subjected to improper impedance Zbias of the bias circuit 120, which may result in non-linear operation of the RF power transistor 105 at higher modulation frequencies (e.g., about 100 MHz or more) of the RF input signal RF_in. The impedance control circuit 320 (for example, as implemented by the bypass capacitor 320*b*) is thus configured to vary a magnitude, phase, resistance, and/or reactance of the impedance Zbias of the bias circuit 120 to improve linearity of the RF power transistor as frequencies of the RF input signal RF_in increase. In contrast, some conventional bias circuits may not include such control over device linearity. For example, as shown in FIGS. 4A-4D, variations in resistance 10*a*, magnitude 10*b*, reactance 10*c* and phase of some conventional bias circuits 20 may be less problematic at RF signal input frequencies of about 5 MHz or less, such that the inclusion of a bypass capacitor 320b or other impedance control circuit 320 in the bias circuits 20 may have provided limited utility but increased complexity, cost, and/or size.

Figure 5A:
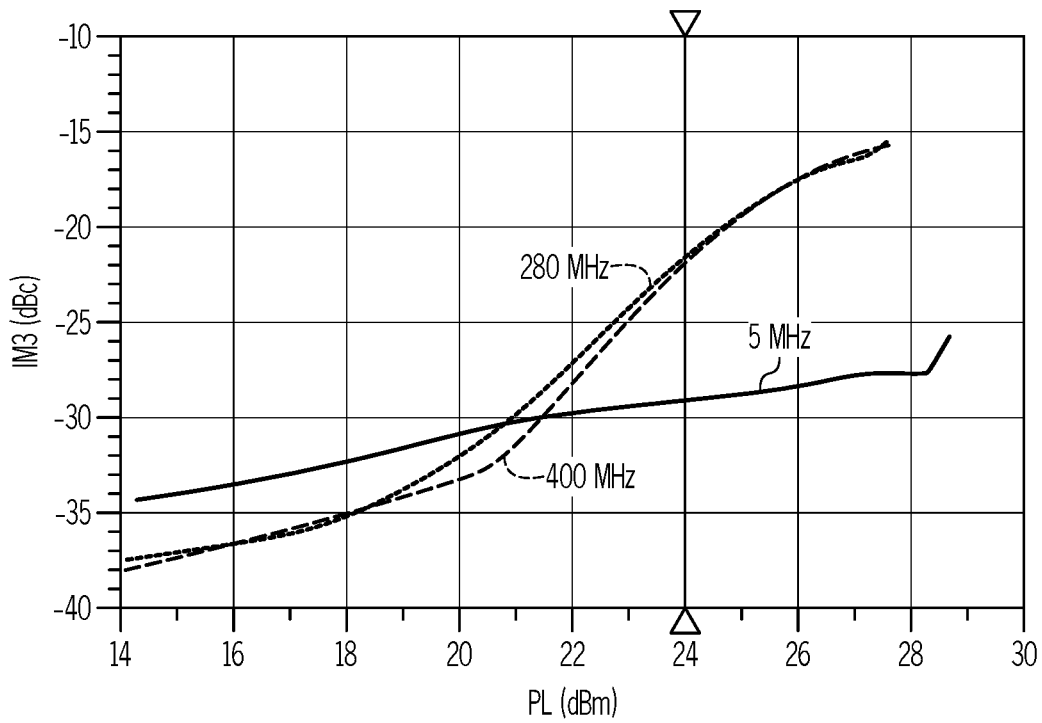
FIGS. 5A and 5B are graphs illustrating changes in intermodulation distortion vs. load power in RF power devices including conventional bias circuits and bias circuits according to some embodiments of the present invention.
Figure 5B:
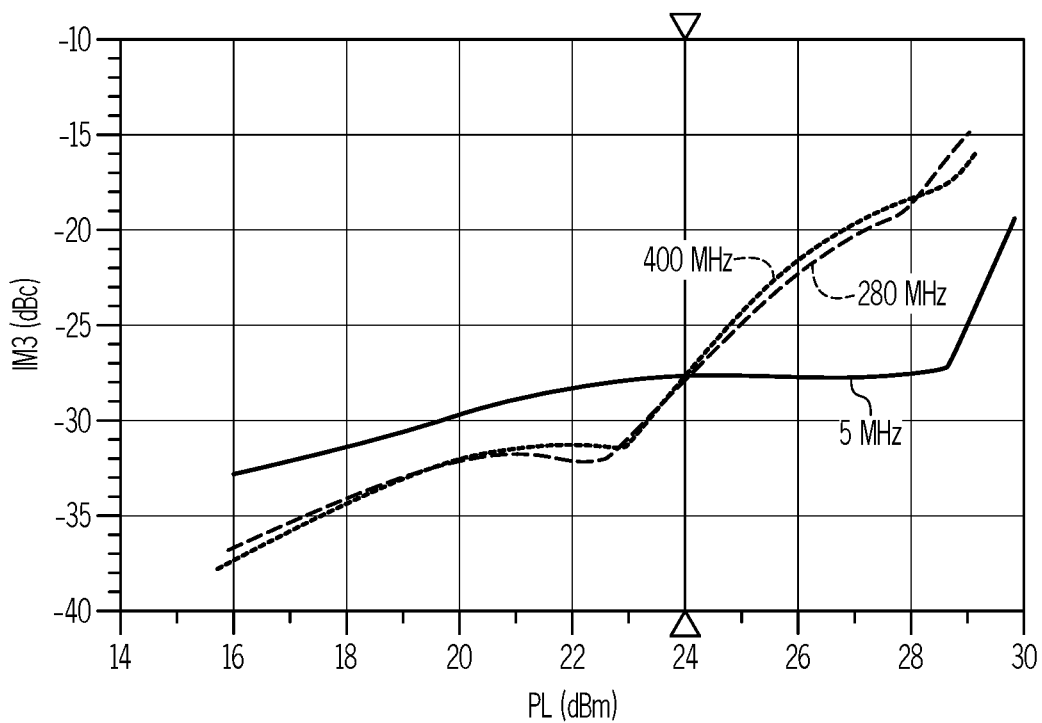

FIGS. 5A and 5B are graphs illustrating load or output power (PL, in decibel milliwatts (dBm)) vs. intermodulation components (IM3, in decibels relative to carrier (dBc)) in RF power devices including conventional bias circuits and bias circuits according to some embodiments of the present invention. In particular, FIG. 5A illustrates example operation of an RF power device including the bias circuit 20b of FIG. 2B, while FIG. 5B illustrates example operation of the RF power device 300b including the bias circuit 120b of FIG. 3B.

Intermodulation distortion (IMD) may refer to the amplitude modulation of signals containing two or more different frequencies, which may result from device nonlinearity. The intermodulation component IM3 may thus be a figure of merit representing the linearity of a device under test. In particular, IM3 may represent the third order intermodulation distortion responsive to a two-tone test or simulation (i.e., by injection of two sinusoidal signals of different frequencies or tones), where a lower IM3 value may indicate greater linearity.

As shown in FIG. 5A, the IM3 value for operation of the RF power device including the bias circuit 20b at an average load power (illustrated by way of example with reference to a load power PL of about 24 dBm) may provide acceptable linearity (e.g., IM3 of about −29) for operation at lower frequencies (e.g., for a 5 MHz RF input signal), but may exceed linearity requirements at higher frequencies (e.g., IM3 of about −21 or −22 for RF input signals of 280 MHz or 400 MHz, respectively). In comparison, as shown in FIG. 5B, the IM3 value for operation of RF power devices 300b including the bias circuit 120b in accordance with some embodiments of the present invention at the average load power PL of 24 dBm is substantially lower (e.g., IM3 of about −27) for operation at higher frequencies, while maintaining similar linearity for operation at lower frequencies. In particular, the graph of FIG. 5B illustrates that bias circuits 120 including impedance control circuits 320 in accordance with embodiments of the present invention may provide an improvement of about 6 dBc for RF input signals of 280 MHz and 400 MHz, while substantially maintaining linearity (e.g., IM3 of about −28) for a 5 MHz RF input signal. It can be seen in both FIGS. 5A and 5B that RF power device performance may degrade at higher load power levels (e.g., greater than about 28 dBm). However, embodiments of the present invention may provide acceptable linearity by maintaining IM3 at about −28 or less over the majority of the desired operating range.

Further embodiments of the present invention may arise from realization that variations in operating characteristics of RF power transistors (for example, due to process variations and/or variations in temperature or other operating conditions) may make it difficult for bias circuits to maintain DC bias conditions to provide the desired operating point (and thus linearity) of the RF power transistors, particularly in light of performance tradeoffs. For example, in the bias circuit 20a of FIG. 2A, the base current (Ib) provided to the input terminal 105b of the RF power transistor RFQ 105 may be controlled in proportion to the base current of the biasing transistor 223, but may introduce significant noise at the power amplifier output. The bias circuit 20b of FIG. 2B may provide a reduction in noise at the output, but may provide less control over variations in the base current Ib with temperature, as the input terminal 105b of the RF power transistor RFQ 105 is not coupled to the base of the biasing transistor 223. That is, advantages provided by some bias circuits may come at the expense of biasing capability to provide the desired constant output current over a range of operating conditions.

Some embodiments of the present invention provide bias circuits including one or more sub-circuits that are configured to control the bias current provided by the bias circuit to the input terminal of an RF power transistor (e.g., a base terminal for a bipolar transistor or a gate terminal for a FET) responsive to variations in the operating characteristics of the RF power transistor. The term Ib may be used herein to refer to the bias current provided to the input terminal of an RF power transistor, which may be a current controlled device, such as a bipolar transistor. The operating characteristics of the RF power transistor may include (but are not limited to) built-in voltage Vbe and current gain β, and may vary, for example, due to variations in device fabrication processes, operating temperature and/or other operating conditions. Changes in the bias current due to such variations in operating characteristics of RF power transistors may affect, among others, linearity, gain, and efficiency, and thus, control over the bias current Ib and/or other DC bias conditions in accordance with embodiments of the present invention may prevent degradation of performance.

Figure 6A:
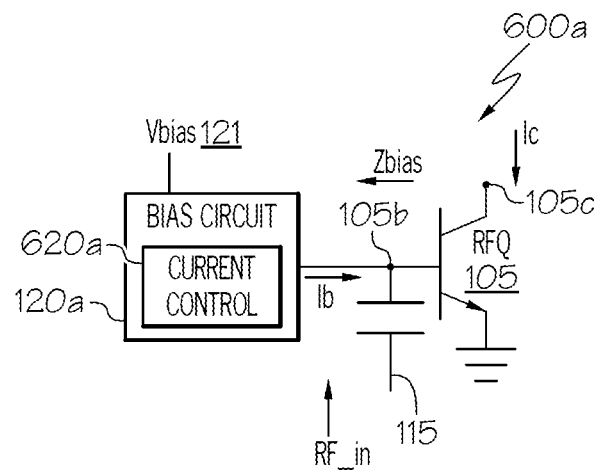
FIGS. 6A and 6B are schematic block and circuit diagrams illustrating examples of bias circuits for RF power devices according to some embodiments of the present invention.
Figure 6B:
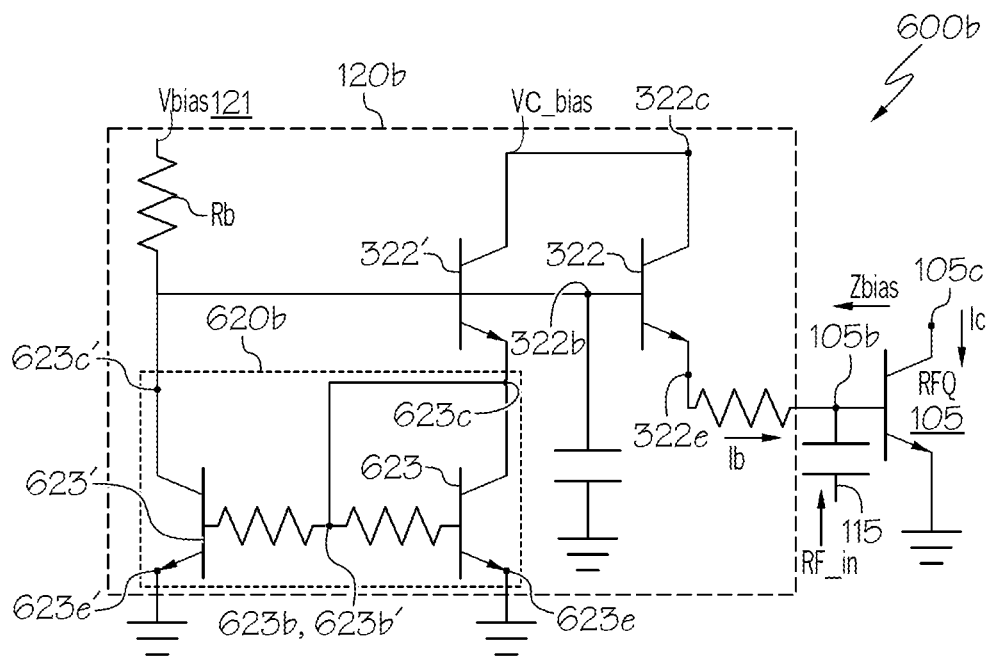

FIGS. 6A and 6B are schematic block and circuit diagrams illustrating examples of RF power devices 600a and 600b including bias circuits in accordance with some embodiments of the present invention. As shown in FIGS. 6A and 6B, a bias circuit 120a, 120b (collectively 120) is coupled between a reference signal input (illustrated by way of example as a reference voltage input Vbias 121) and an input terminal (illustrated by way of example as a base terminal 105b) of an RF power transistor RFQ (illustrated by way of example as a bipolar transistor 105). As noted above, the RF power transistor 105 may be an HBT, but embodiments of the present invention are not limited to any particular implementation of the RF power transistor.

The bias circuit 120 includes a current control circuit 620a, 620b (collectively 620) that is configured to control a bias current Ib provided to the input terminal 105b of the RF power transistor 105 responsive to variations in operating characteristics of the RF power transistor 105 so as to provide a substantially constant output current at an output terminal 105c of the RF power transistor 105. More particularly, the current control circuit 620 is configured to adjust the current Ib provided to the base terminal 105b of the RF power transistor 105 in order to keep the collector current Ic at the collector terminal 105c as constant as possible, despite variations in the operating characteristics of the RF power transistor 105. In some embodiments, the varying operating characteristics or parameters include, but are not limited to, variations in the built-in voltage (Vbe) and the current gain (Hfe or β), which may vary with changes in temperature and/or manufacturing process variations of the RF power transistor 105.

FIG. 6B illustrates an example implementation of current control circuit 620 as a current mirror circuit 620b that is configured to improve control of the bias current Ib by the bias circuit 120 over varying operating characteristics of the RF power device 105. For example, as shown in FIG. 6B, the RF power device 105 may have a current gain β (where the base current Ib=the collector current Ic/β) that varies with temperature. Process variations (e.g., wafer-to wafer variations in manufacturing) may also contribute to variations in current gain β and/or built-in voltage Vbe across various RF power transistor devices 105.

The current mirror circuit 620b may be included in the bias circuit 120 control loop in order to compensate for variations in the bias current Ib due to such variations in operating characteristics, so as to provide or maintain a substantially constant collector current Ic. In the example of FIG. 6B, the current mirror circuit 620b is coupled to a follower transistor 322 of the bias circuit 120b. The follower transistor 322 is a bipolar device including a base terminal 322b coupled to the reference voltage input 121, and an emitter terminal 322e coupled to the base terminal 105b of the RF power transistor 105. One or more additional follower transistors 322' may be included. The current mirror circuit 620b includes first and second mirror transistors 623 and 623' having base terminals 623b and 623b' coupled to one another, and emitter terminals 623e and 623e' coupled to an electrical ground. The collector terminal 623c of the first mirror transistor 623 is coupled to the collector terminal 322c of the follower transistor 322 (through connection to the emitter terminal of follower transistor 322'), while the collector terminal 623c' of the second mirror transistor 623' is coupled to the base terminal 322b of the follower transistor 322 (as well as to the base terminal of the follower transistor 322').

As shown in FIG. 6B, a voltage applied to the base terminal of the follower transistor 322' (via the reference voltage input 121 and bias resistor Rb) may result in an increase in current to ground, which may cause the voltage at the base terminals 623b, 623b' of the mirror transistors 623, 623' to increase, resulting in current flow from the respective collector terminals, until the transistors 623, 623', 322', and 322 have approximately equal collector currents (and therefore approximately equal base currents). The current mirror circuit 620b may thus be configured as a Wilson current source, although embodiments of the present invention are not limited to this configuration.

The collector current of the follower transistor 322 provides the bias current Ib to the base terminal 105b of the RF power transistor 105. As such, the bias current Ib provided to the base terminal 105b of the RF power transistor 105 may be maintained in proportion to the current applied to the input terminal(s) of the transistors 623, 623'. The current control circuits 620 as described herein may thus be used to control the current Ib provided to the input terminal of an RF power transistor device 105, so as to reduce or minimize variations in the output current Ic. Bias circuits including current mirror or other current control circuits 620 may thereby be configured to compensate for variations in operating characteristics (e.g., Vbe, β, etc., due to temperature and/or manufacturing variations) in order to maintain a substantially constant output current (e.g., collector current Ic), which remains proportional to the current through Rb, determined by Vbias 121.

Figure 7:
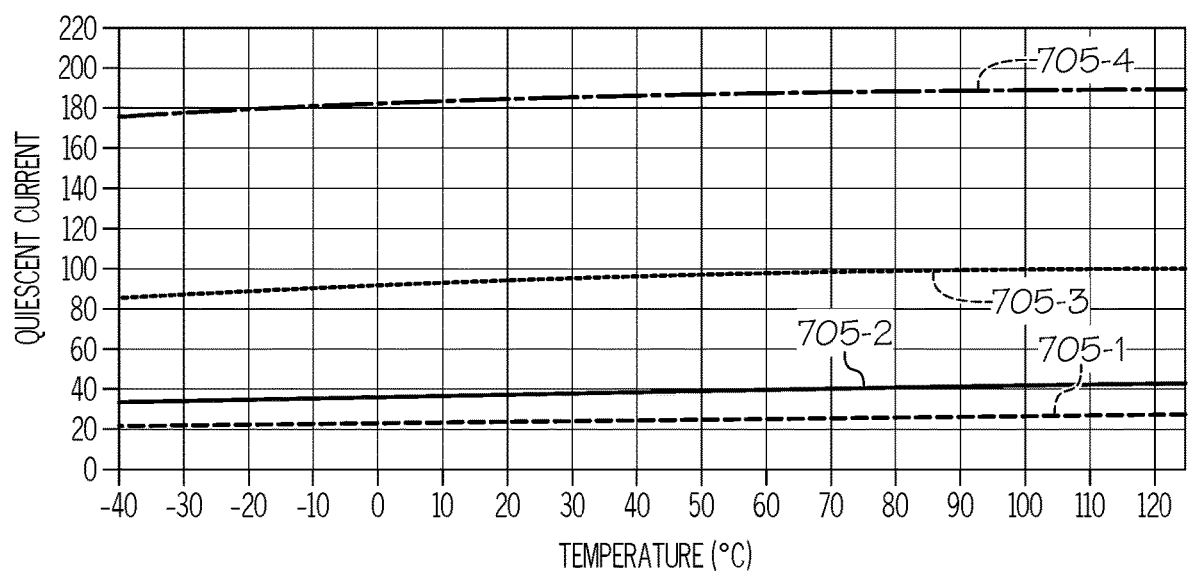
FIG. 7 is a graph illustrating changes in quiescent current vs. temperature in RF power devices including bias circuits according to some embodiments of the present invention.

FIG. 7 is a graph illustrating changes in quiescent current vs. temperature in bias circuits for RF power devices in accordance with some embodiments of the present invention. As shown in FIG. 7, RF power devices including bias circuits and current control circuits according to embodiments of the present invention may be operated while maintaining substantially constant quiescent currents at each stage 705-1, 705-2, 705-3, 705-4 of a multi-stage amplifier (illustrated by way of example as a four-stage design) from temperatures ranging from about −40 degrees C. to about 125 degrees C.

Figure 8A:
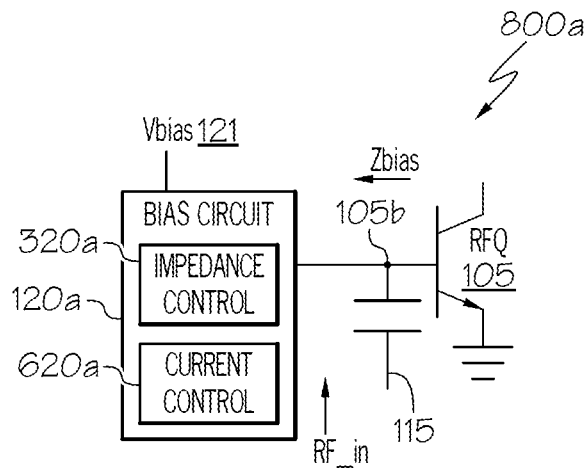
FIGS. 8A and 8B are schematic block and circuit diagrams illustrating examples of bias circuits for RF power devices according to some embodiments of the present invention.
Figure 8B:
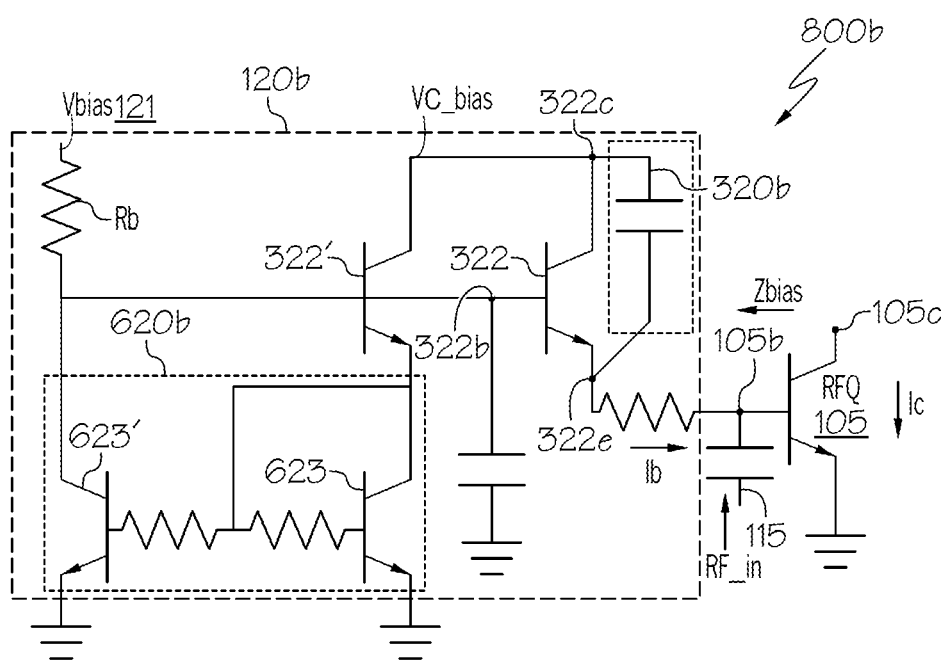

Some embodiments of the present invention may include bias circuits for RF power devices that are configured to combine the advantages described above, that is, to provide both improved linearity at higher modulation frequencies and compensate for variations in operating characteristics due to variations in operating conditions and/or fabrication processes. FIGS. 8A and 8B are schematic block and circuit diagrams illustrating examples of bias circuits for RF power devices 800a, 800b including bias circuits in accordance with some embodiments of the present invention that are configured to provide both impedance control and current control for RF transistor devices.

As shown in FIGS. 8A and 8B, the RF power devices 800a, 800b include a bias circuit 120a, 120b (collectively 120) coupled between a reference voltage input 121 and an input terminal (illustrated by way of example as a base terminal 105b) of an RF power transistor RFQ (illustrated by way of example as a bipolar transistor 105, such as an HBT). The bias circuit 120 includes an impedance control circuit 320a, 320b (collectively 320) that is configured to operate in conjunction with a current control circuit 620a, 620b (collectively 620).

The impedance control circuit 320 is configured to vary an impedance Zbias of the bias circuit 120 as seen at the input terminal 105b of the RF power transistor 105 responsive to an RF input signal RF_in provided to the input terminal 105, as similarly discussed above with reference to FIGS. 3A and 3B. As shown in FIG. 8B, the impedance control circuit 320 may be implemented by at least one capacitor 320b that is configured to bypass the follower transistor 322 responsive to a frequency of the RF input signal RF_in. More particularly, the capacitor 320b is coupled between the collector 322c and emitter 322e terminals of the follower transistor 322, and acts as a short circuit at higher frequencies so as to change or vary the impedance Zbias presented by the bias circuit 120 at the base 105b of the RF power transistor 105 responsive to changes in the modulation frequency of the RF input signal RF_in.

The current control circuit 620 is also configured to control a bias current Ib provided to the input terminal 105b of the RF power transistor 105 responsive to variations in operating characteristics (e.g., Vbe, β, etc.) of the RF power transistor 105, as similarly discussed above with reference to FIGS. 6A and 6B. As shown in FIG. 8B, the current control circuit 620 may be implemented as a current mirror circuit 620b that is coupled to the follower transistor 322 that is coupled to the bypass capacitor 320b. More particularly, the current mirror circuit 620b is configured to maintain the bias current Ib provided to the base terminal 105b of the RF power transistor 105 in proportion to the current applied to the input terminal(s) of the transistors 623, 623', 322', and/or 322, in order to keep the collector current Ic at the collector terminal 105c as constant as possible despite variations in the operating characteristics of the RF power transistor 105 over temperature and/or device variability.

Figure 9:
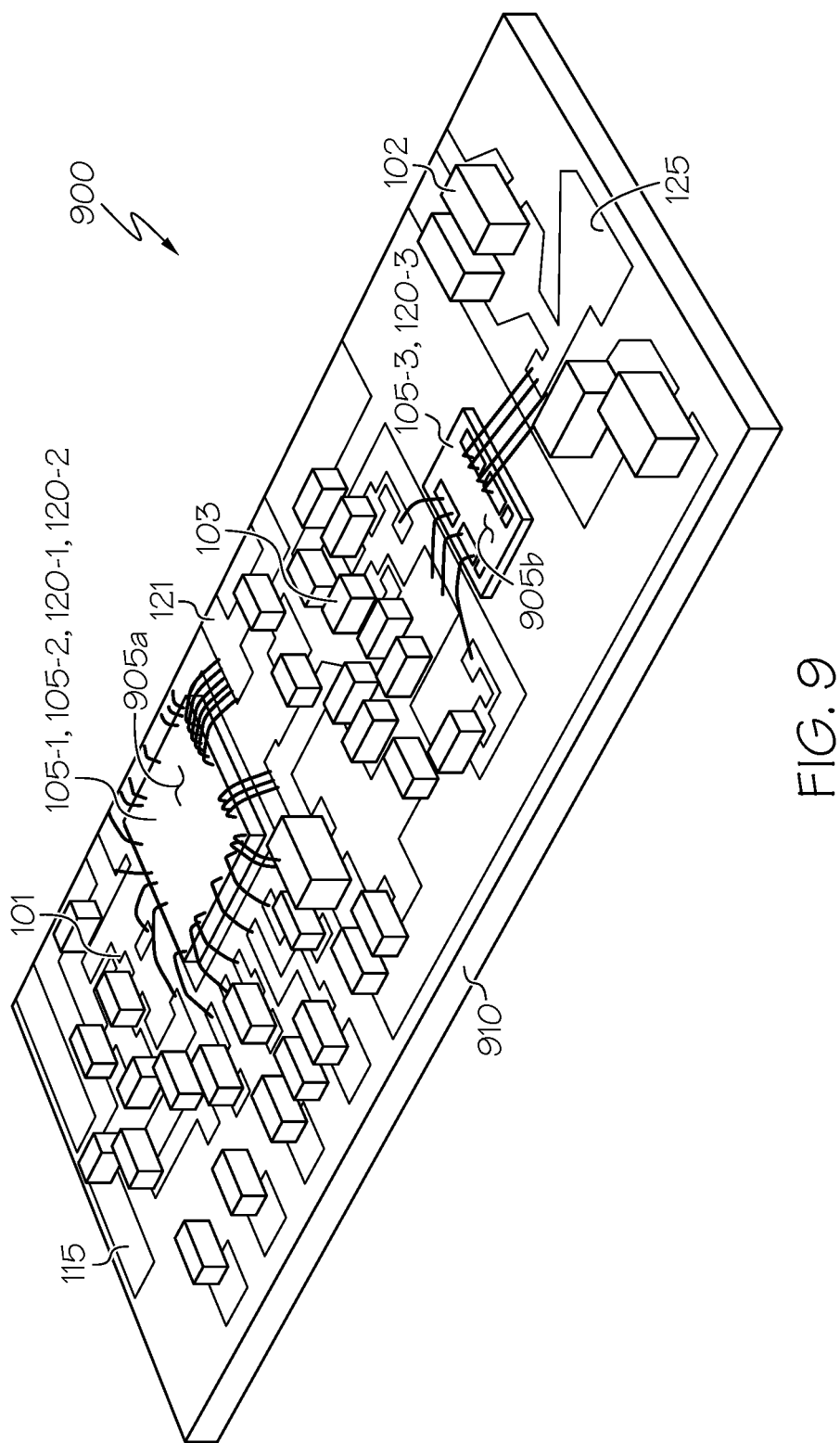
FIG. 9 is a perspective view illustrating an example RF power device package including RF power devices and bias circuits according to some embodiments of the present invention.

FIG. 9 is a perspective view illustrating an RF power device package including bias circuits and RF power devices in accordance with some embodiments of the present invention. As shown in FIG. 9, an RF power device package 900 includes a submount 910 including RF package input leads 115, RF output leads 125, and at least one non-RF lead 121 thereon. In some embodiments, the submount 910 may be a structure including one or more electrically insulating members with conductive layers defining patterns, traces, routing, and/or leads thereon, such as a multilayer laminate, printed circuit board (PCB), or redistribution layer (RDL) stack). In some embodiments, the submount 910 may include a flange or other electrically and/or thermally conductive attachment surface. Example packages are described in greater detail below with reference to FIGS. 10A to 12.

Still referring to FIG. 9, a first RF power transistor die 905*a* is provided on the submount 910 and coupled to the RF input lead 115 by one or more components (e.g., SMDs) defining an input matching network 101. The first RF power transistor die 905*a* may include a plurality of RF power transistors 105 (e.g., transistors 105-1, 105-2) and respective bias circuits 120 (e.g., 120-1, 120-2) integrated in the die 905*a* (or otherwise coupled to the respective transistors 105-1, 105-2).

In some embodiments, a second RF transistor die 905*b* may be coupled to the output of the first RF power transistor die 905*a*, for example, in a multi-stage amplifier arrangement. The second RF power transistor die 905*b* may likewise include a plurality of RF power transistors 105 (e.g., transistors 105-3) and respective bias circuits 120 (e.g., 120-3) integrated in the die 905*b* (or otherwise coupled to the respective transistors 105-3), and may be coupled to the output of the first RF transistor die 905*a* by one or more components defining an inter-stage matching network 103. The output of the second RF power transistor die 905*b* may be coupled to the RF package output lead 125 by one or more components (e.g., SMDs) defining an output matching network 102.

In some embodiments, the first and second RF power transistor dies 905*a* and 905*b* may be of a same material and/or transistor type (e.g., GaAs-based bipolar transistor dies). In some embodiments, the first and second RF power transistor dies 905*a* and 905*b* may be of a different materials and/or transistor types (e.g., a GaAs-based bipolar transistor die 905*a* and a GaN-based, Si-based, or SiC-based field effect transistor die 905*b*). For example, the RF power transistors of the first and second RF power transistor dies 905*a* and 905*b* may implement a multi-stage RF power amplifier, with transistors of the first RF power transistor die 905*a* providing one or more driver stages, and transistors of the second RF power transistor die 905*b* providing the output stage.

It will be understood that the package 900 of FIG. 9 is illustrated by way of example only, and that one or more of the illustrated components or stages may be omitted, or one or more additional components or stages may be included. For example, in some embodiments the second RF transistor die 905*b* may not be present, and the output of the first RF power transistor die 905*a* may be coupled to the RF package output lead 125 by one or more components defining the output matching network 102, as similarly shown in the example packages of FIGS. 10A to 12. More generally, the RF power device package 900 may include one or more RF power transistor dies 905*a*, 905*b* including RF power transistors coupled in various single or multi-stage arrangements.

The bias circuits 120 may be coupled between the non-RF lead 121 and the input terminal of one or more RF power transistors of the RF power transistor die 905*a*, 905*b*. One or more of the bias circuits 120 may include a respective impedance control circuit 320 (e.g., 320*a*, 320*b*) that is configured to vary a bias circuit impedance Zbias at the input terminal of a respective RF power transistor responsive to an RF input signal provided to the transistor input terminal(s) via the RF input lead 115. Additionally or alternatively, one or more of the bias circuits 120 may include a respective a current control circuit 620 (e.g., 620*a*, 620*b*) that is configured to control a bias current Ib provided to the input terminal of a respective RF power transistor responsive to variations in operating characteristics of the RF power transistor. That is, the RF power device package 900 may include bias circuits 120 similar to any of the RF power devices 300*a*, 300*b*, 600*a*, 600*b*, and/or 800*a*, 800*b* described herein.

FIGS. 10A-10F, 11A-11C, and 12 are cross-sectional views of example RF power device packages including RF power devices and bias circuits according to some embodiments of the present invention. For ease of illustration, the power device packages 1000*a*-1000*f,* 1100*a*-1100*c,* and 1200 of FIGS. 10A-10F, 11A-11C, and 12 are shown as including a single RF power transistor die 905 coupled between components 101 and 102 defining input and output matching networks, where the RF power transistor die 905 may include a plurality of RF power transistors (e.g., transistors 105-1, 105-2) and respective bias circuits (e.g., 120-1, 120-2) integrated in the die 905. However, it will be understood that more than one power transistor die (e.g., 905*a*, 905*b*), associated inter-stage matching networks (e.g., 103), and/or one or more surface mount components (e.g., 320*b*) for implementing the respective bias circuits and/or other circuits may be included in one or more of the packages 1000*a*-1000*f,* 1100*a*-1100*c,* and 1200 in some embodiments. More generally, the various packages shown in FIGS. 10A to 12 are provided by way of example, and may be used for implementation of any of the embodiments described herein.

Figure 10A:
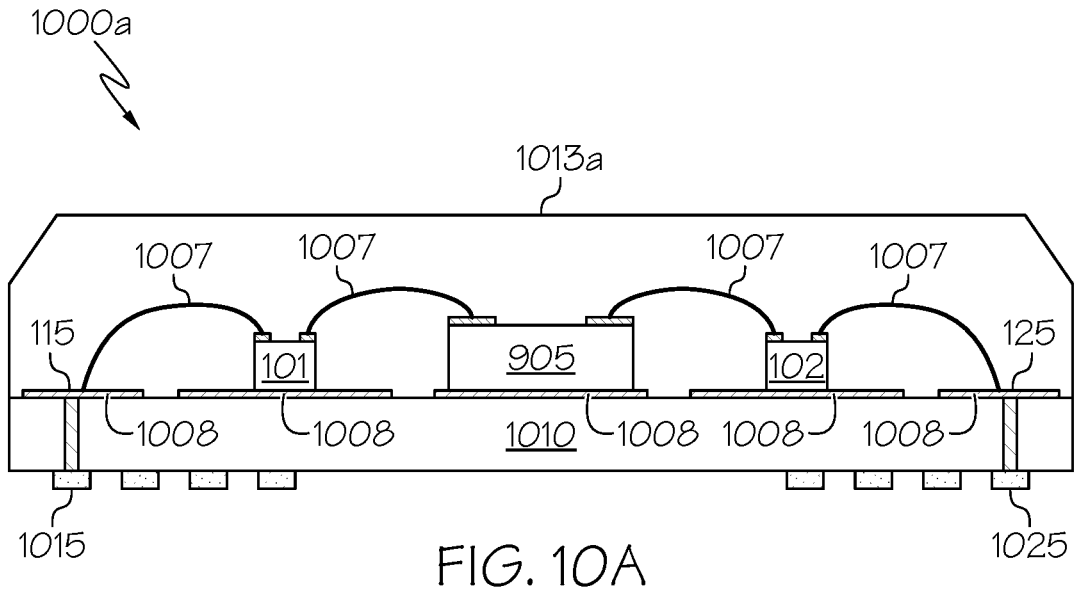
FIGS. 10A, 10B, 10C, 10D, 10E, and 10F are cross-sectional views of example RF power device packages including RF power devices and bias circuits according to some embodiments of the present invention.
Figure 10B:
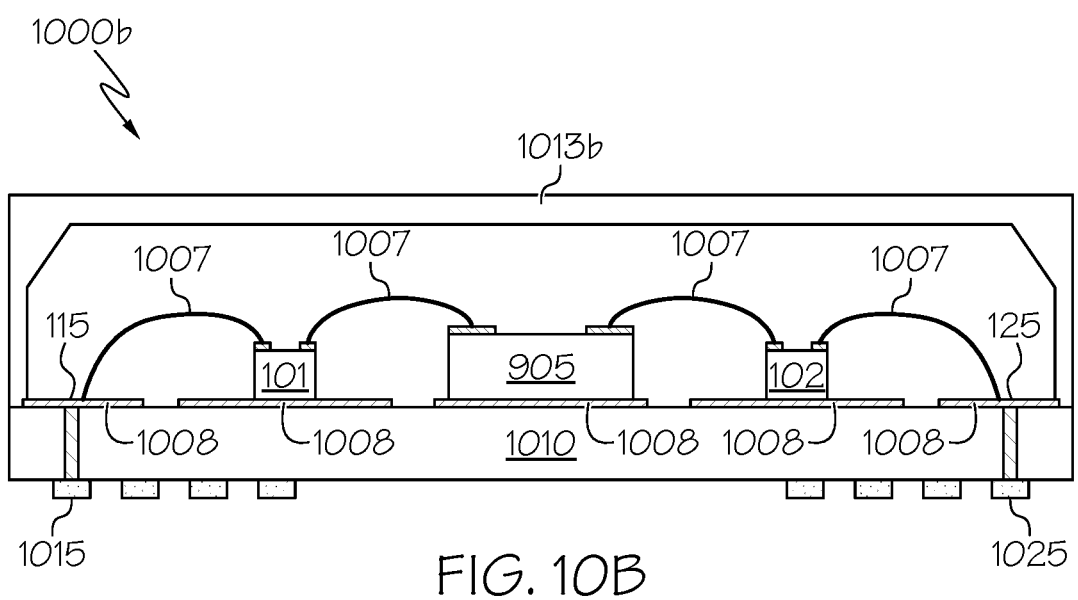
Figure 10C:
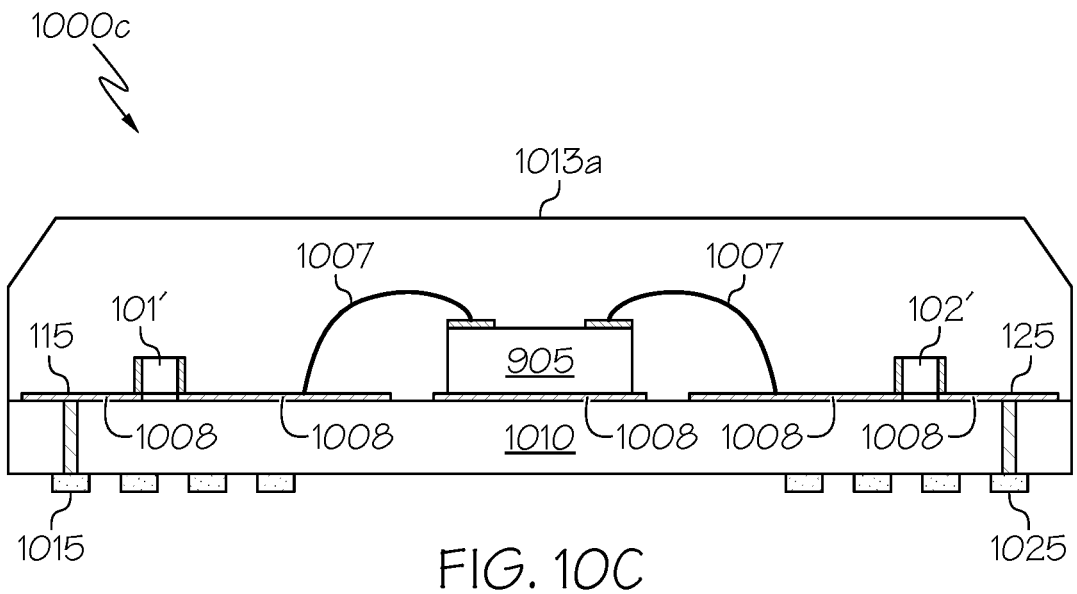
Figure 10D:
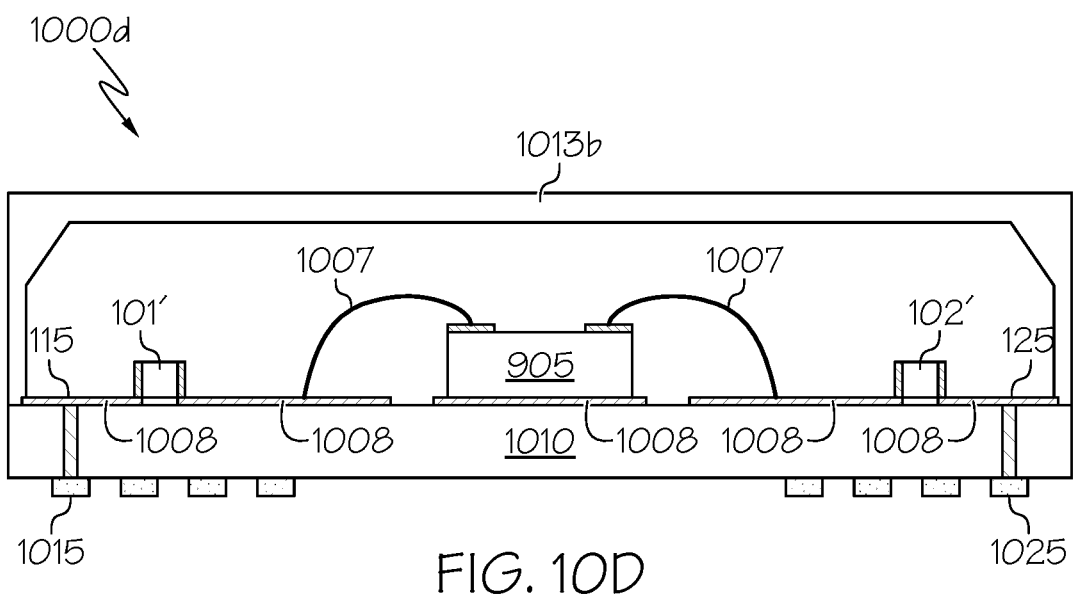
Figure 10E:
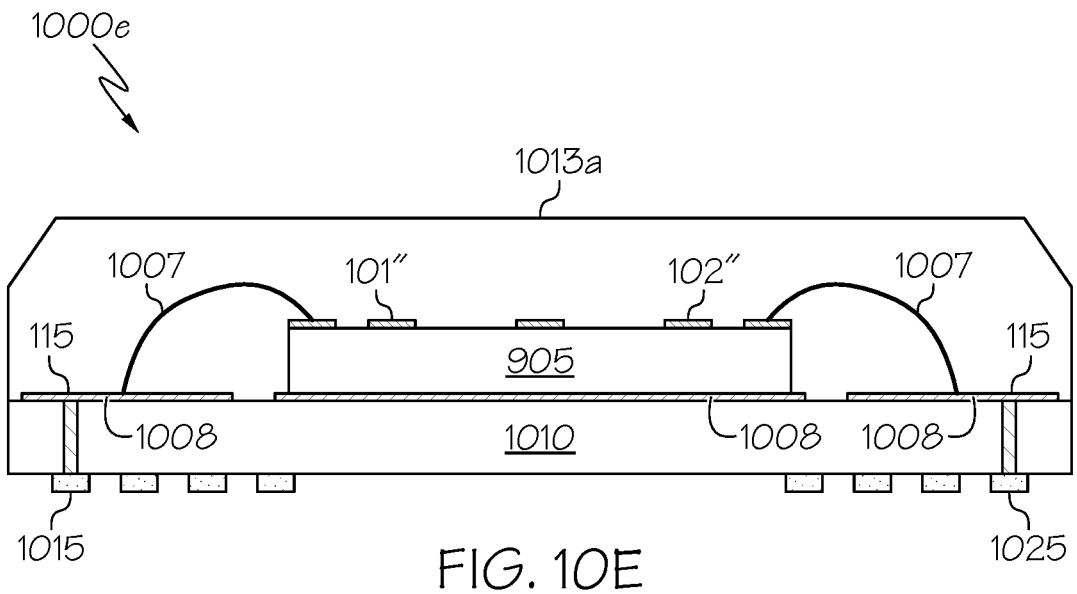
Figure 10F:
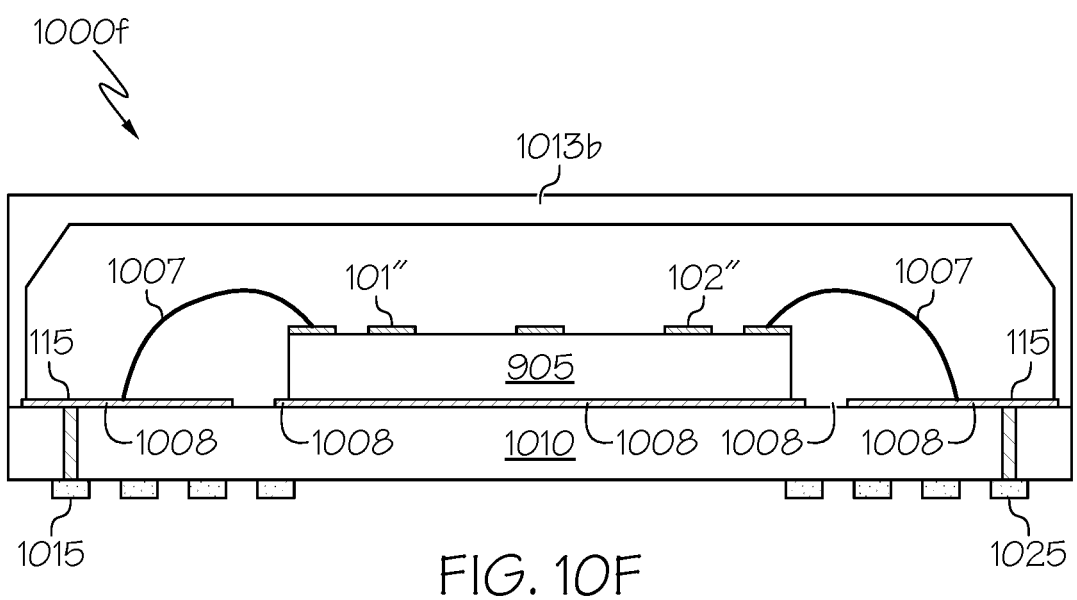

As shown in FIGS. 10A-10F, RF power device packages 1000*a*-1000*f* include components 905, 101 (or 101' or 101", collectively 101), 102 (or 102' or 102", collectively 102), and connections similar to the packages described herein mounted on a submount 1010 implemented as a laminate structure. The submount 1010 includes one or more electrically insulating members with conductive layers 1008 defining patterns, traces, routing, and/or leads thereon. The RF power transistor die 905 is mounted on the submount 1010 and connected between the RF input 115 and RF output 125 by bondwires 1007. In FIGS. 10A and 10B, the RF power transistor die 905 is coupled between the RF input 115 and RF output 125 using input and output matching components implemented as shunt components 101 and 102, which are surface mounted on the submount 1010. In FIGS. 10C to 10F, the RF power transistor die 905 is coupled between the RF input 115 and RF output 125 using series input and output matching components, which can be implemented as surface mounted components 101' and 102' (in FIGS. 10C and 10D), and/or as components 101" and 102" that are internal to the RF power transistor die 905 (in FIGS. 10E and 10F). In the packages 1000*a*, 1000*c*, and 1000*e* of FIGS. 10A, 10C, and 10E, the submount 1010 is protected by an overmold member 1013*a*, such as overmolded plastic (OMP) or other non-conductive encapsulant material that encapsulates the components 101, 102, 905. In the packages 1000*b*, 1000*d*, and 1000*f* of FIGS. 10B, 10D, and 10F, the submount 1010 is protected by a lid member 1013*b*, such as a ceramic (e.g., alumina) lid that seals an open-air cavity surrounding the components 101, 102, 905. In the example packages 1000*a*-1000*f,* input and output connections 1015 and 1025 are implemented as land grid array (LGA)-type connections, but embodiments of the present disclosure are not limited to any particular connection type.

As shown in FIGS. 11A-11C and 12, RF power device packages 1100*a*, 1100*b*, 1100*c*, and 1200 include components 101, 102, 905 and wire bond connections 1007 similar to the packages 1000*a*-1000*f,* but are mounted on a submount 1110, 1210 implemented as a conductive base or flange. The flange 1110, 1210 may be an electrically conductive material, for example, a copper layer/laminate or an alloy or metal-matrix composite thereof. In some embodiments, the flange 1110, 1210 may include a copper-molybdenum (CuMo) layer, CPC (Cu/MoCu/Cu), or other copper alloys, such copper-tungsten CuW, and/or other laminate/multi-layer structures. The components 101, 102, 905 are attached to the submount 1110, 1210 by one or more conductive die attach layers 1109. The conductive submount 1110, 1210 thus provides both an attachment surface for the components 101, 102, 905, as well as thermal conductivity (e.g., a heat sink) for dissipating or otherwise transmitting heat generated by the components to the outside of the packages 1100a, 1100b, 1100c, and 1200.

Figure 11A:
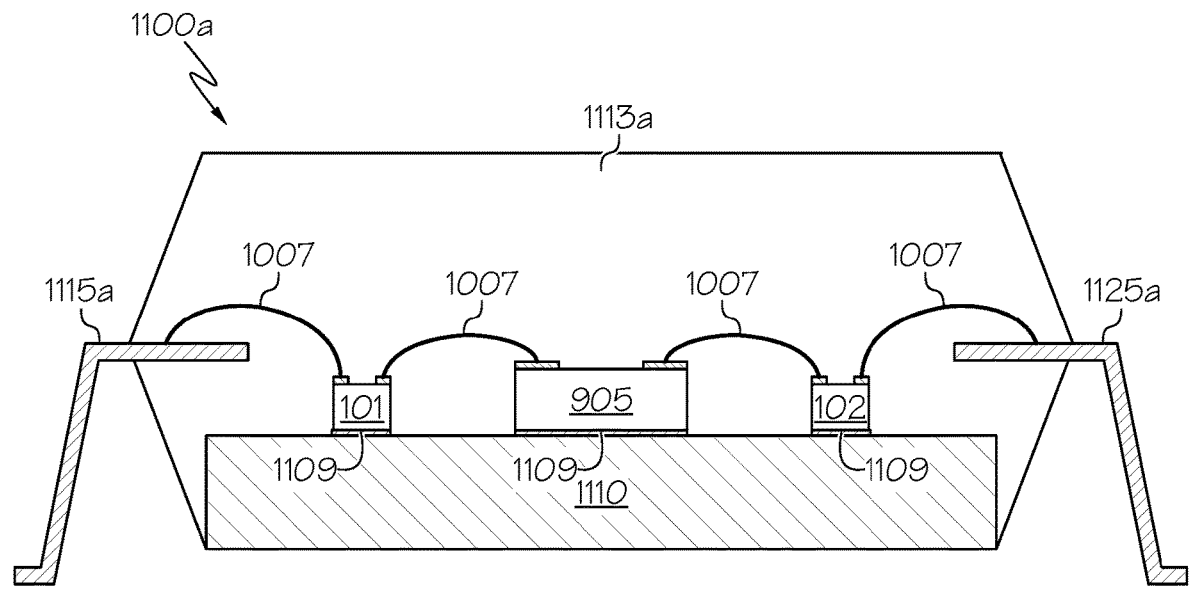
FIGS. 11A, 11B, and 11C are cross-sectional views of example RF power device packages including RF power devices and bias circuits according to some embodiments of the present invention.

In the package 1100a of FIG. 11A, the submount 1110 is protected by an overmold member 1013a, such as OMP or other non-conductive encapsulant material. The overmold member 1013a also supports the RF input lead 1115a and RF output lead 1125a, which are coupled to the input and output matching components 101 and 102 by respective bondwires 1007.

Figure 11B:
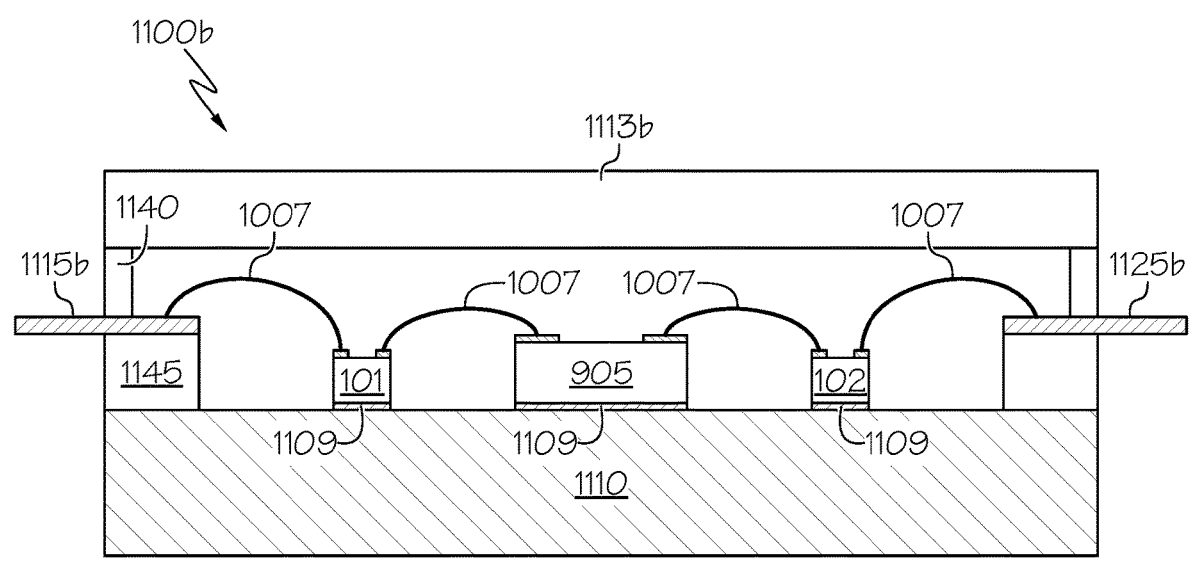

In the package 1100b of FIG. 11B, the submount 1110 is protected by a lid member 1113b that is attached to the submount 1110 by one or more sidewall members 1140, 1145. The lid member 1113 and/or sidewall members 1140, 1145 may include ceramic materials (e.g., alumina), and define an open cavity surrounding the components 101, 102, 905, on the submount 1110. One or more of the sidewall members 1140, 1145 also support the RF input lead 1115b and RF output lead 1125b, which are coupled to the input and output matching components 101 and 102 by respective bondwires 1007.

Figure 11C:
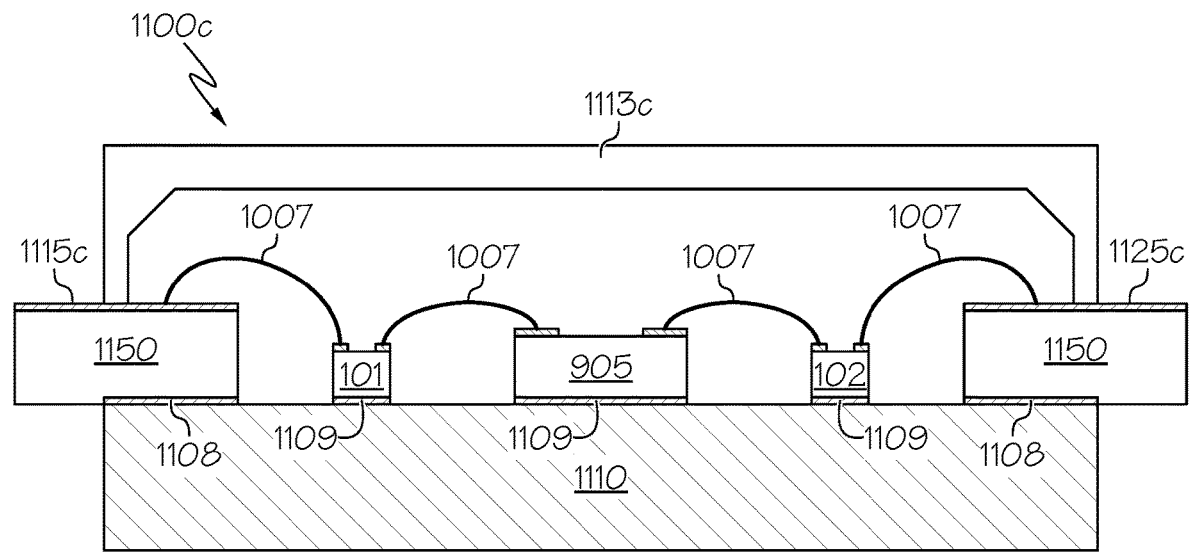

In the package 1100c of FIG. 11C, the submount 1110 is similarly protected by a lid member 1113c that is attached to the submount 1110 by one or more sidewall members 1150, which define an open cavity surrounding the components 101, 102, 905, on the submount 1110. The lid member 1113c may be a ceramic material (e.g., alumina), while the sidewall members 1150 are illustrated as printed circuit board (PCB). The RF input lead 1115c and RF output lead 1125c are implemented as conductive traces on the PCB sidewall members 150. The PCB sidewall members 150 are attached to the flange 1110, e.g., by a conductive glue 1108.

Figure 12:
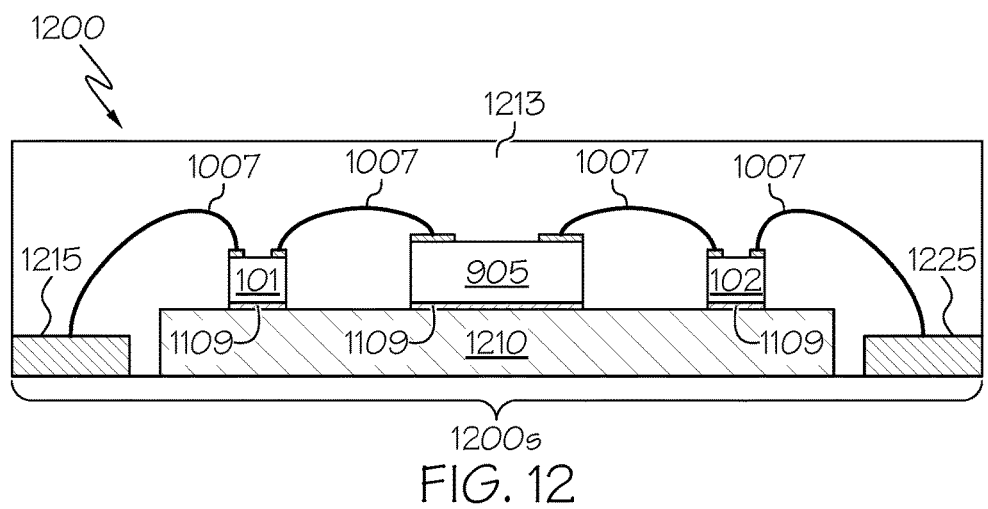
FIG. 12 is a cross-sectional view of an example RF power device package including RF power devices and bias circuits according to some embodiments of the present invention.

FIG. 12 illustrates an example flat no-lead package 1200, such as a dual flat no-lead (DFN) or quad flat no-lead (QFN) package. In the package 1200, the submount 1110 is protected by an overmold member 1213, such as plastic or other non-conductive encapsulant material. The overmold member 1213 also supports the RF input pad 1215 and RF output pad 1225, which are coupled to the input and output matching components 101 and 102 by respective bondwires 1007. The overmold member 1213 provides a substantially flat mounting surface 1200s for the package 1200. Respective surfaces of the submount 1210 (which may function as a heat sink) and the RF input and output pads 1215 and 1225 (which provide connections for input and output RF signals) are substantially coplanar with the mounting surface 1200s. In a DFN package, the RF input and output pads 1215 and 1225 provide terminals on two sides of the package 1200, while a QFN package may include additional pads surrounding the submount 1210 to provide terminals on four sides of the package 1200.

Embodiments of the present invention may thus provide RF power devices including bias circuits that are configured to reduce or minimize variations in the bias circuit impedance Zbias and/or control variations in the bias current Ib at the base of an RF power transistor, in order to maintain device linearity and/or a constant collector current over a wide range of RF input signal frequencies or bandwidths (e.g., from MHz to GHz ranges) and/or operating conditions.

In some embodiments, the RF power devices may be configured to operate in at least a portion of one or more of the 2.3-2.7 GHz, 3.3-4.2 GHz, or 5.1-5.9 GHz frequency bands. In some embodiments, the RF power devices may be configured to operate at frequencies above 10 GHz. More generally, the RF power devices of embodiments of the present invention may operate in any frequency band, including in one or more LTE frequency bands in the range of about 400 MHz to about 6 GHz.

Embodiments of the present invention may be used in various RF power products, such as amplifiers and front end modules. Particular embodiments of the present disclosure may be used in massive Multiple Input Multiple Output (mMIMO) active antennas (which may include an array of transistors implemented in transmitter/receiver pairs that utilize matrix multiplication for transmitting and receiving RF signals) as well as various cellular infrastructure (CIFR) RF power products (including, but not limited to 5 W, 10 W, 20 W, 40 W, 60 W, 80 W and different frequency bands), e.g., for 5G and base station applications, including macro (e.g., 20-80 W and different frequency bands) average power applications. Embodiments of the present disclosure may also be applied to radar and monolithic microwave integrated circuit (MMIC)-type applications.

While primarily described herein with reference to controlling current and/or bias circuit impedance at a base of a bipolar power transistor device, such as HBT-based power amplifiers, bias circuits according to embodiments of the present invention are not limited to use with bipolar transistor devices. That is, embodiments of the present invention may be independent of transistor technology, such that the bias circuits described herein may be used with any high-power RF transistor technologies. For example, embodiments of the present invention may be used in any RF power device applications where maintaining linearity over operating conditions is desired, such as in FETs, BJTs, etc. Embodiments of the present invention may also be used in any RF power devices (including switching and/or amplifier applications) where controlling current in an RF power transistor over varying operating characteristics and/or conditions is desired.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to examples that are schematic illustrations of idealized embodiments (and intermediate structures) of the invention. Sizes of elements and/or regions in the drawings may be exaggerated for clarity. Additionally, variations from the illustrations as a result, for example, of manufacturing techniques and/or tolerances, are to be expected. Thus, embodiments of the invention should not be construed as limited to the illustrations herein but are to include deviations that result, for example, from manufacturing.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A radio frequency ("RF") power device, comprising:
an RF power transistor; and
a bias circuit comprising a first transistor coupled between a reference voltage input and an input terminal of the RF power transistor in a follower configuration, and an impedance control circuit that is configured to bypass the first transistor responsive to an RF input signal provided to the input terminal.

2. The RF power device of claim 1, wherein the impedance control circuit comprises at least one capacitor coupled to the first transistor.

3. The RF power device of claim 2, wherein the at least one capacitor is configured to bypass the first transistor responsive to a frequency of the RF input signal.

4. The RF power device of claim 2, wherein the first transistor is a bipolar transistor, and wherein the at least one capacitor is coupled between a collector terminal and an emitter terminal of the first transistor.

5. The RF power device of claim 4, wherein the RF power transistor comprises a bipolar transistor and the input terminal comprises a base terminal thereof, and wherein the emitter terminal of the first transistor is coupled to the base terminal of the RF power transistor.

6. The RF power device of claim 2, wherein the RF power transistor is a first RF power transistor that defines a first stage of an RF power amplifier, and further comprising:
a second RF power transistor defining a second stage of the RF power amplifier, wherein an input terminal of the second RF power transistor is coupled to an output terminal of the first RF power transistor.

7. The RF power device of claim 6, wherein the bias circuit comprising the impedance control circuit is a first bias circuit comprising a first impedance control circuit, and further comprising:
a second bias circuit coupled between a second reference voltage input and the input terminal of the second RF power transistor, the second bias circuit comprising a second impedance control circuit that is configured to vary an impedance of the second bias circuit at the input terminal of the second RF power transistor responsive to the RF input signal provided to the input terminal of the first RF power transistor.

8. The RF power device of claim 7, wherein the first and second RF power transistors comprise bipolar transistors.

9. The RF power device of claim 2, wherein the at least one capacitor has a capacitance of about 400 picofarads or more.

10. The RF power device of claim 1, wherein the impedance control circuit is configured to stabilize a magnitude and/or phase of an impedance of the bias circuit responsive to changes in modulation frequency of the RF input signal between about 5 MHz to about 400 MHz, or about 400 MHz to about 6 GHz.

11. A radio frequency ("RF") power device, comprising:
a first RF power transistor of a first stage of an RF power amplifier;
a second RF power transistor of a second stage of the RF power amplifier, wherein an input terminal of the second RF power transistor is coupled to an output terminal of the first RF power transistor; and
a bias circuit coupled between a reference voltage input and an input terminal of the first RF power transistor, the bias circuit comprising an impedance control circuit that is configured to vary an impedance of the bias circuit at the input terminal of the first RF power transistor responsive to an RF input signal provided to the input terminal,
wherein the first RF power transistor comprises a bipolar transistor, and the second RF power transistor comprises a field effect transistor.

12. The RF power device of claim 11, wherein the first RF power transistor comprises gallium arsenide (GaAs), and the second RF power transistor comprises gallium nitride (GaN) and/or silicon carbide (SiC).

13. The RF power device of claim 11, wherein the bias circuit further comprises a first transistor coupled between the reference voltage input and the input terminal of the first RF power transistor, and wherein the impedance control circuit comprises at least one capacitor coupled to the first transistor.

14. A radio frequency ("RF") power device, comprising:
an RF power transistor; and
a bias circuit comprising a first transistor coupled between a reference voltage input and an input terminal of the RF power transistor in a follower configuration, a current control circuit that is coupled to an input of the first transistor and configured to control a bias current provided to the input terminal of the RF power transistor responsive to variations in operating characteristics of the RF power transistor, and a second transistor that is coupled between the first transistor and the current control circuit.

15. The RF power device of claim 14, wherein the current control circuit comprises a current mirror circuit coupled to the second transistor.

16. The RF power device of claim 15, wherein the second transistor is a bipolar transistor, and wherein the current mirror circuit comprises first and second mirror transistors coupled to emitter and base terminals of the second transistor, respectively.

17. The RF power device of claim 16, wherein the RF power transistor comprises a bipolar transistor and the input terminal comprises a base terminal thereof, and wherein an emitter terminal of the first transistor is coupled to the base terminal of the RF power transistor.

18. The RF power device of claim 16, wherein the first and second mirror transistors comprise bipolar transistors having respective base terminals coupled to the emitter terminal of the second transistor.

19. The RF power device of claim 16, wherein the operating characteristics of the RF power transistor comprise a built-in voltage and/or current gain that vary based on an operating temperature and/or fabrication process thereof.

20. The RF power device of claim 19, wherein the current mirror circuit is configured to vary the bias current responsive to the variations in the operating characteristics to provide a substantially constant output current at an output terminal of the RF power transistor from operating temperatures of about −40 degrees Celsius (C) to about 125 degrees C.

21. The RF power device of claim 14, wherein the bias circuit further comprises an impedance control circuit that is configured to vary an impedance of the bias circuit at the input terminal of the RF power transistor responsive to an RF input signal provided to the input terminal.

22. The RF power device of claim 14, wherein the RF power transistor is a first RF power transistor that defines a first stage of an RF power amplifier, and further comprising:
a second RF power transistor defining a second stage of the RF power amplifier, wherein an input terminal of the second RF power transistor is coupled to an output terminal of the first RF power transistor,
wherein the first RF power transistor comprises a bipolar transistor, and the second RF power transistor comprises a field effect transistor.

23. A radio frequency ("RF") power device, comprising:
an RF power transistor; and
a bias circuit comprising a first transistor coupled between a reference voltage input and an input terminal of the RF power transistor in a follower configuration, the bias circuit comprising:
an impedance control circuit that is configured to vary an impedance of the bias circuit at the input terminal of the RF power transistor responsive to an RF input signal provided to the input terminal, wherein the impedance control circuit is configured to bypass the first transistor responsive to a frequency of the RF input signal; and
a current control circuit that is configured to control a bias current provided to the input terminal of the RF power transistor responsive to variations in operating characteristics of the RF power transistor.

24. The RF power device of claim 23, wherein the RF power transistor is a first RF power transistor that defines a first stage of an RF power amplifier, and further comprising:
a second RF power transistor defining a second stage of the RF power amplifier, wherein an input terminal of the second RF power transistor is coupled to an output terminal of the first RF power transistor,
wherein the first RF power transistor comprises a bipolar transistor, and the second RF power transistor comprises a field effect transistor.

25. The RF power device of claim 23, wherein the impedance control circuit comprises at least one capacitor coupled to the first transistor.

26. The RF power device of claim 25, wherein the at least one capacitor is configured to bypass the first transistor responsive to the frequency of the RF input signal.

27. The RF power device of claim 25, wherein the current control circuit comprises a current mirror circuit coupled to the first transistor.

28. The RF power device of claim 27, wherein the first transistor is a bipolar transistor, and wherein the at least one capacitor is coupled between a collector terminal and an emitter terminal of the first transistor.

29. The RF power device of claim 28, wherein the RF power transistor comprises a bipolar transistor and the input terminal comprises a base terminal thereof, and wherein the emitter terminal of the first transistor is coupled to the base terminal of the RF power transistor.

30. The RF power device of claim 29, wherein the current mirror circuit comprises first and second mirror transistors coupled to the collector terminal and a base terminal of the first transistor, respectively.

31. The RF power device of claim 30, wherein the first and second mirror transistors comprise bipolar transistors having respective base terminals coupled to the collector terminal of the first transistor.

32. The RF power device of claim 27, wherein:
the at least one capacitor is configured to stabilize a magnitude and/or phase of the impedance of the bias circuit responsive to changes in modulation frequency of the RF input signal; and
the current mirror circuit is configured to vary the bias current responsive to the variations in the operating characteristics to provide a substantially constant output current at an output terminal of the RF power transistor.

33. A radio frequency (RF) power device package, comprising:
a submount including RF input and output leads and at least one non-RF lead;
an RF power transistor die on the submount; and a bias circuit comprising a first transistor coupled between the at least one non-RF lead and an input terminal of an RF power transistor of the RF power transistor die in a follower configuration, wherein the bias circuit comprises:
  an impedance control circuit that is configured to vary an impedance of the bias circuit at the input terminal of the RF power transistor responsive to an RF input signal provided to the input terminal via the RF input lead, wherein the impedance control circuit is configured to bypass the first transistor responsive to a frequency of the RF input signal; and/or
  a current control circuit that is configured to control a bias current provided to the input terminal of the RF power transistor responsive to variations in operating characteristics of the RF power transistor.

34. The RF power device package of claim 33, wherein the RF power transistor is a first RF power transistor that defines a first stage of an RF power amplifier, and further comprising:
  a second RF power transistor defining a second stage of the RF power amplifier, wherein an input terminal of the second RF power transistor is coupled to an output terminal of the first RF power transistor,
  wherein the first RF power transistor comprises a bipolar transistor, and the second RF power transistor comprises a field effect transistor.

35. The RF power device package of claim 33, wherein:
  the impedance control circuit comprises at least one capacitor coupled to the first transistor; and/or
  the current control circuit comprises a current mirror circuit coupled to the first transistor.

36. The RF power device package of claim 35, wherein the at least one capacitor is configured to bypass the first transistor responsive to the frequency of the RF input signal.

37. The RF power device package of claim 35, wherein the first transistor is a bipolar transistor, and wherein:
  the at least one capacitor is coupled between a collector terminal and an emitter terminal of the first transistor; and/or
  the current mirror circuit comprises first and second mirror transistors coupled to the collector terminal and a base terminal of the first transistor, respectively.

38. The RF power device package of claim 37, wherein the RF power transistor comprises a bipolar transistor and the input terminal comprises a base terminal thereof, and wherein the emitter terminal of the first transistor is coupled to the base terminal of the RF power transistor.

39. The RF power device package of claim 33, wherein the RF power transistor is a first RF power transistor that defines a first stage of a RF power amplifier, and further comprising:
  a second RF power transistor on the submount and defining a second stage of the RF power amplifier, wherein an input terminal of the second RF power transistor is coupled to an output terminal of the first RF power transistor.

40. The RF power device package of claim 39, wherein the bias circuit comprising the impedance control circuit and/or the current control circuit is a first bias circuit comprising a first impedance control circuit and/or a first current control circuit, and further comprising:
  a second bias circuit coupled between a reference voltage input and the input terminal of the second RF power transistor, the second bias circuit comprising:
    a second impedance control circuit that is configured to vary an impedance of the second bias circuit at the input terminal of the second RF power transistor responsive to the RF input signal provided to the input terminal of the first RF power transistor; and/or
    a second current control circuit that is configured to control a bias current provided to the input terminal of the second RF power transistor responsive to variations in operating characteristics of the second RF power transistor.

41. The RF power device package of claim 40, wherein the first and second RF power transistors comprise bipolar transistors.

42. The RF power device package of claim 39, wherein the first RF power transistor comprises a bipolar transistor, and the second RF power transistor comprises a field effect transistor.

43. The RF power device package of claim 42, wherein the first RF power transistor comprises gallium arsenide (GaAs), and the second RF power transistor comprises gallium nitride (GaN) and/or silicon carbide (SiC).

* * * * *

UNITED STATES PATENT AND TRADEMARK OFFICE
CERTIFICATE OF CORRECTION

PATENT NO. : 11,281,245 B1
APPLICATION NO. : 17/159825
DATED : March 22, 2022
INVENTOR(S) : Joly et al.

It is certified that error appears in the above-identified patent and that said Letters Patent is hereby corrected as shown below:

In the Specification

Column 13, Line 48: Please correct "(3," to read -- i, --

Signed and Sealed this
Twenty-third Day of August, 2022

*Katherine Kelly Vidal*
Katherine Kelly Vidal
*Director of the United States Patent and Trademark Office*